United States Patent [19]

Ota et al.

[11] Patent Number: 5,561,606
[45] Date of Patent: Oct. 1, 1996

[54] METHOD FOR ALIGNING SHOT AREAS ON A SUBSTRATE

[75] Inventors: Kazuya Ota, Tokyo; Masaharu Kawakubo, Odawara; Kenji Nishi, Kawasaki, all of Japan

[73] Assignee: Nikon Corporation, Tokyo, Japan

[21] Appl. No.: 538,467

[22] Filed: Oct. 3, 1995

Related U.S. Application Data

[63] Continuation of Ser. No. 361,158, Dec. 21, 1994, abandoned, which is a continuation of Ser. No. 11,697, Feb. 1, 1993, abandoned, which is a continuation-in-part of Ser. No. 935,424, Aug. 26, 1992, abandoned.

[30] Foreign Application Priority Data

| Aug. 30, 1991 | [JP] | Japan | 3-245055 |
| Feb. 3, 1992 | [JP] | Japan | 4-047493 |
| Mar. 3, 1992 | [JP] | Japan | 4-45413 |

[51] Int. Cl.$^6$ ........................... H01L 21/78
[52] U.S. Cl. ................. 364/489; 364/488; 364/578
[58] Field of Search .................. 364/578, 489, 364/490, 491, 559; 356/375, 401

[56] References Cited

U.S. PATENT DOCUMENTS

| 4,712,016 | 12/1987 | Matsumura | 250/548 |
| 4,723,221 | 2/1988 | Matsuura et al. | 364/559 |
| 4,779,211 | 10/1988 | March | 364/559 |
| 4,780,617 | 10/1988 | Umatate et al. | 250/548 |
| 4,830,500 | 5/1989 | Kuroki et al. | 356/401 |
| 4,833,621 | 5/1989 | Umatate | 364/491 |
| 4,870,288 | 9/1989 | Abuku et al. | 250/548 |
| 4,914,601 | 4/1990 | Smyth, Jr. | 364/490 |
| 4,971,444 | 11/1990 | Kato | 356/375 |
| 5,050,111 | 9/1991 | Ayata et al. | 364/559 |

*Primary Examiner*—Kevin J. Teska
*Assistant Examiner*—Russell W. Frejd
*Attorney, Agent, or Firm*—Shapiro and Shapiro

[57] ABSTRACT

Plural shot areas arranged in succession in a two-dimensional array on a substrate are aligned to a predetermined reference position in a fixed coordinate system. At least three of the plural shot areas are selected as specified shot areas. Coordinate values (positions) of alignment marks associated, respectively, with the specified shot areas are measured. Anticipated coordinate values are calculated from preset coordinate values, based on an array model of the shot areas, predetermined by a first equation. A unique relation defined by a second equation is assumed, between the anticipated coordinate values and actual coordinate values in the alignment. Parameters of the relation are determined so as to minimize the average error between the measured coordinate values and coordinate values calculated from the relation. Actual coordinate values of the shot areas on the substrate are calculated based on the parameters and the anticipated coordinate values.

26 Claims, 11 Drawing Sheets

METHOD FOR ALIGNING SHOT AREAS ON A SUBSTRATE

This is a continuation of application Ser. No. 08/361,158 filed Dec. 21, 1994, which is a continuation of application Ser. No. 08/011,697 filed Feb. 1, 1993, which is a continuation-in-part of application Ser. No. 07/935,424 filed Aug. 26, 1992, all now abandoned.

BACKGROUND OF THE INVENTION

1. Field of the Invention

The present invention relates to a method for aligning a processed substrate, in an exposure apparatus, a repairing apparatus, an inspection apparatus or the like for producing semiconductor devices and liquid crystal display devices.

2. Related Background Art

In exposure apparatus for transferring circuit patterns of masks or reticles (hereinafter collectively called reticles) in superposed manner onto a semiconductor substrate (wafer) constituting the processed substrate, the reticle pattern and the semiconductor substrate have to be precisely aligned. Among such apparatus, there is frequently employed the exposure apparatus of so-called step-and-repeat type, which supports a semiconductor substrate on a two-dimensionally movable stage and repeats the steps of stepwise moving said semiconductor substrate by said stage and exposing said semiconductor substrate in succession to the circuit pattern of the reticle, and, in particular, such exposure apparatus of reduction production type, or so-called stepper, is commonly used.

In the following there will be outlined an aligning method for the semiconductor substrate, disclosed in the U.S. Pat. No. 4,780,617 and 4,833,621 and employed in the conventional steppers.

On the semiconductor substrate, there are formed plural chip patterns, including alignment marks and arranged regularly according to predetermined coordinates of arrangement. However, even when the semiconductor substrate is stepped according to the designed coordinate values, it is not necessarily exactly aligned to the exposure position, because of the following reasons:

(1) remaining rotational error $\theta$ of the semiconductor substrate;

(2) orthogonality error w in the stage coordinate system (or in the shot arrangement);

(3) linear elongation/contraction Rx, Ry of the semiconductor substrate.; and (4) offset (parallel displacement) Ox, Oy of the semiconductor substrate (center position).

The coordinate conversion of the semiconductor substrate based on these four error (or six parameters) can be described by first-order conversion equations.

Thus, for a semiconductor substrate on which plural chip patterns including alignment marks are regularly arranged, following first-order transformation model is defined for transforming the coordinate system (x, y) on said substrate into the coordinate system (X, Y) of the stage:

$$\begin{pmatrix} X \\ Y \end{pmatrix} = \begin{pmatrix} a & b \\ c & d \end{pmatrix} \begin{pmatrix} x \\ y \end{pmatrix} + \begin{pmatrix} e \\ f \end{pmatrix} \quad (1)$$

The transformation parameters a–f in this model can be determined by the following minimum square approximation.

At first, from the plural chip patterns (shot areas) on the substrate, there are selected n shot areas (n being an integer satisfying $n \geq 3$). The alignment marks $(x_1, y_1), (x_2, y_2), \ldots, (x_n, y_n)$ respectively attached to said shot areas are used for the alignment to a predetermined reference position and the coordinate values $(x_{M1}, y_{M1}), (x_{M2}, y_{M2}), \ldots, (x_{Mn}, y_{Mn})$ are measured. The difference $(\Delta x, \Delta y)$ between the value $(X_i, Y_i)$ obtained by substituting the coordinate values $(x_i, y_i)$ ($i=1, \ldots, n$) of the alignment marks of the selected shot areas into the equation (10 and the measured values $(x_{Mi}, y_{Mi})$ at the alignment is considered as the alignment error. Said alignment error $\Delta x, \Delta y$ can be defined by the following equation:

$$\begin{pmatrix} \Delta x \\ \Delta y \end{pmatrix} = \sum_{i=1}^{n} \begin{pmatrix} (x_{Mi} - X_i)^2 \\ (y_{Mi} - Y_i)^2 \end{pmatrix} \quad (2)$$

By partially differentiating this equation (2) with each of the parameters a–f and placing each partial differential equal to zero, there can be obtained simultaneous equations:

$$\frac{\partial}{\partial a} \begin{pmatrix} \Delta x \\ \Delta y \end{pmatrix} = 0, \ldots, \frac{\partial}{\partial f} \begin{pmatrix} \Delta x \\ \Delta y \end{pmatrix} = 0 \quad (3)$$

The parameters a–f can be determined by solving these simultaneous equations. Subsequently the coordinates of all the shot areas on the substrate can be calculated from the equation (1) and can be utilized for the alignment of each shot area.

If satisfactory approximation cannot be attained by the first-order transformation equation, the alignment of the semiconductor substrate can be executed: by a higher order equation:

$$\begin{pmatrix} X \\ Y \end{pmatrix} = \sum_{k=0}^{N} \begin{pmatrix} a_k & b_k \\ c_k & d_k \end{pmatrix} \begin{pmatrix} x^k \\ y^k \end{pmatrix} \quad (4)$$

The equation (4) is naturally reduced to the equation in case of N=1.

However, the semiconductor substrate to be processed on the stepper is often already subjected to a heat treatment as a part of the manufacturing process for the semiconductor device, and, for this reason, the chip patterns which are originally arranged in regular manner according to a predetermined coordinate system are sometimes so severely distorted as not be approximated by the first-order transformation equation, due to the elongation, contraction and deformation resulting from such thermal treatment. In such case it is difficult to attain a satisfactory precision of alignment over the entire substrate.

On the other hand, in the alignment utilizing a second- or higher-order transformation equation, the number of terms of such equation is larger than that in the first-order transformation. Consequently, in order to secure the sufficient precision of alignment, it becomes necessary to measure the coordinate values on a larger number of alignment marks than in the first-order transformation, so that the entire throughput of the apparatus has to be sacrificed.

Also in case some chip patterns alone on the substrate are significantly aberrated from the arrangement, the alignment utilizing first-order transformation equation is unable to exactly determine the coordinate of such arrangement. Stated differently, in case of a chip pattern including a significant non-linear error (particularly irregular non-linear error), a desired precision of alignment cannot be obtained, and the production yield is deteriorated because of formation of defective chips. In such situation, it is still difficult to attain the desired precision of alignment even with the application of a second- or higher-order transformation equation, and such application will deteriorate the throughput.

SUMMARY OF THE INVENTION

An object of the present invention is to provide an aligning method capable of realizing an excellent precision of alignment even for a semiconductor substrate subjected to various deformations, without loss in the throughput of the entire apparatus.

In relation to FIGS. 1 to 3 and 5 showing an embodiment, the present invention is applicable to a method of aligning, in succession, plural shot areas $S_i$ regularly arranged along a predetermined coordinate system of arrangement on a processed substrate W to a predetermined reference position in a fixed coordinate system defining the moving position of said processed substrate W.

The above-mentioned object can be attained, according to the present invention, by a method comprising steps of selecting, from plural shot areas $S_i$, at least three shot areas $S_1$–$S_8$ as specified shot areas; measuring the positions of alignment marks MX, MY respectively attached to said specified shot areas $S_1$–$S_8$ as the coordinate positions on the fixed coordinate system; calculating the anticipated coordinate values of arrangement from the preset coordinate values of arrangement, based on an arrangement model of the shot areas $S_i$ on the processed substrate W, given by a first equation; assuming that a unique relation stands, according to a second equation, between the anticipated coordinate values of arrangement and the actual coordinate values of arrangement at the alignment and determining the parameters of said relation in such a manner as to minimize the average errors between the measured coordinate positions of the marks MX, MY and the coordinate values of arrangement calculated from said equation; and calculating the actual coordinate values of arrangement of the shot areas $S_i$ on said processed substrate W, based on said parameters and said anticipated coordinate values of arrangement, whereby each of the shot areas $S_i$ is aligned to said reference position, by controlling the movement of the processed substrate W according to said actual coordinate values of arrangement.

Also the invention provides a method in which said first equation is a polynomial, a trigonometrical function or an exponential function determined empirically and having an order higher than that of said second equation.

The invention provides a method wherein said first equation is determined from the positions, measured as the coordinate values on said fixed coordinate system, of the alignment marks MX, MY attached to the shot areas $S_i$ on one or more processed substrates W.

The invention provides a method in which the number of said specified shot areas is selected equal to or less than the number of the shot areas for calculating said first equation.

The invention provides a method in which said specified shot areas $S_1$–$S_8$ are selected according to the result of calculation of said first equation and to the coordinate positions of the marks MX, MY measured for calculating said first equation.

The invention provides a method wherein said first equation is modified according to the positions measured as the coordinate values on said fixed coordinate system, of the alignment marks MX, MY associated with the specified shot areas $S_1$–$S_8$ of the processed substrate W, so as to reduce the average errors between these plural measured values and the coordinate values calculated from said equation.

Finally, the invention provides a method in which said specified shot areas $S_1$–$S_8$ are varied for every unit number of the processed substrates W.

In the present invention, the anticipated coordinate values of arrangement are determined by employing, as the first equation, a predetermined arrangement model (model function) of the shot areas $S_i$, and the actual coordinate values of arrangement are determined by calculating the parameters of a second equation defining the relation between said anticipated coordinate values and the actual coordinate values. Consequently a function of low order, such as a first-order function, can be selected as said second equation. It is therefore rendered possible to reduce the number of parameters to be calculated, thereby reducing the number of the specified shot areas $S_1$–$S_8$ used for mark position measurement. Thus the time required for alignment can be reduced, and the loss in the throughput of the exposure apparatus can also be prevented. Still the error components (particularly non-linear ones) that cannot be covered by the second equation can be corrected by the first equation, so that the alignment can be achieved within a short time without sacrificing the precision of alignment.

Another alignment method of the present invention for aligning, for every unit number N (N being an integer equal to or larger than 2) of substrates W, plural shot areas arranged in a two-dimensional array on said substrates according to design coordinates of arrangement as shown in FIGS. 1, 8 and 9, in succession to a predetermined reference position in a fixed coordinate system defining the moving positions of said substrates, by measuring the coordinate positions in said fixed coordinate system of at least three shot areas selected in advance as specified shot areas from said plural shot areas (steps 313–315), then calculating the coordinate position of each of the plural shot areas on said substrate in said fixed coordinate system by statistical processing of thus measured plural coordinate positions (step 316), and controlling the moving position of these substrates according to the calculated coordinate position of each of said plural shot areas, effects steps, prior to the alignment of plural shot areas of a k-th substrate (k being an integer equal to or larger than 2 but not exceeding N) to the reference position according to the coordinate positions calculated by said statistical processing, of measuring the coordinate positions of substantially all shot areas (designated shot areas) on at least a specified substrate among those up to (k–1)-th (steps 102–104), then comparing thus measured coordinate positions of substantially all shot areas with those of substantially all shot areas calculated by said statistical processing, and designating the shot areas where the deviation between the measured coordinate position and the calculated one exceeds a predetermined tolerance, as selected shot areas in advance (steps 305–306).

Then the alignment to the reference position on said k-th substrate is conducted, according to the calculated coordinate positions for the shot areas other than said selected shot areas, and, for said selected shot areas, according to coordinate positions different from the calculated coordinate positions (steps 320, 321).

In the above-mentioned alignment method, within the substrates W of a number N for example constituting a lot, substantially all the shots are measured for example on the first substrate or first several substrates W (specified substrates). The design coordinates of arrangement of shot areas on the substrate W are represented as $(x_i, y_i)$ (i=0, 1, 2, . . .) and the measured coordinate of arrangement of each shot area is represented as $(x_{Mi}, y_{Mi})$. For example in the first-order approximation, there stand following relations between the design coordinates $(x_i, y_i)$ of arrangement and the measured coordinates $(x_{Mi}, y_{Mi})$ employing six parameters a–f:

$$x_{Mi} = ax_i + by_i + e$$

$y_{Mi} = cx_i + dy_i + f$ as in the equation (1).

The above-mentioned six parameters can in principle be determined by the measured coordinates $(x_{Mi}, y_{Mi})$ of three shots. However, it is also possible to determine said six parameters for example by the minimum square method so as to minimize $\Delta x$ and $\Delta y$ in the equation (2). Also in the second-order approximation the design coordinates $(x_i, y_i)$ and the measured coordinates $(x_{Mi}, Y_{Mi})$ can be correlated with ten parameters, which can be determined by the results of measurement of 5 or more shots. The approximation of a higher order can also be made in a similar manner.

Then by substituting the design arrangement coordinates $(x_i, y_i)$ of the shot areas and the determined parameters in the right-hand terms of the equation (1) or a higher-order transformation equation, there can be determined the calculational coordinates $(X_i, Y_i)$ for the shot areas as the new arrangement coordinates. In this manner, the adopted approximation is estimated applicable in the shot areas where the deviation between the measured arrangement coordinate $(x_M, y_{Mi})$ and the calculational arrangement coordinate $(X_i, Y_i)$ is small. On the other hand, the shot areas with larger deviations involve errors of higher order, so that said approximation is estimated not applicable, and such shot areas are designated as selected shot areas.

Thus, in the alignment of the subsequent substrates W, the shot areas for which said approximation is estimated applicable are aligned according to the calculational arrangement coordinates $(X_i, Y_i)$ determined by the equation (1) or a higher-order transformation equation (however the parameters thereof are determined for each substrate W). On the other hand, the selected shot areas for which said approximation is estimated not applicable are aligned for example according to the individually measured coordinates $(x_{Mi}, y_{Mi})$ so that a highly precise alignment can be attained even for shot areas involving large non-linear errors. Such alignment method scarcely affects the throughput, because the measurement is required, in the remaining substrates excluding the first one or the first several substrates (specified substrates), only for a small number of shot areas for determining the parameters of the transformation equation.

In the foregoing description of the means for resolving the drawbacks in the prior art, the drawings showing an embodiment have been referred to, for the purpose of ease of understanding, but it is to be understood that the present invention is by no means limited by such embodiment.

DESCRIPTION OF THE PREFERRED EMBODIMENTS

[1st embodiment]

Figure 1:
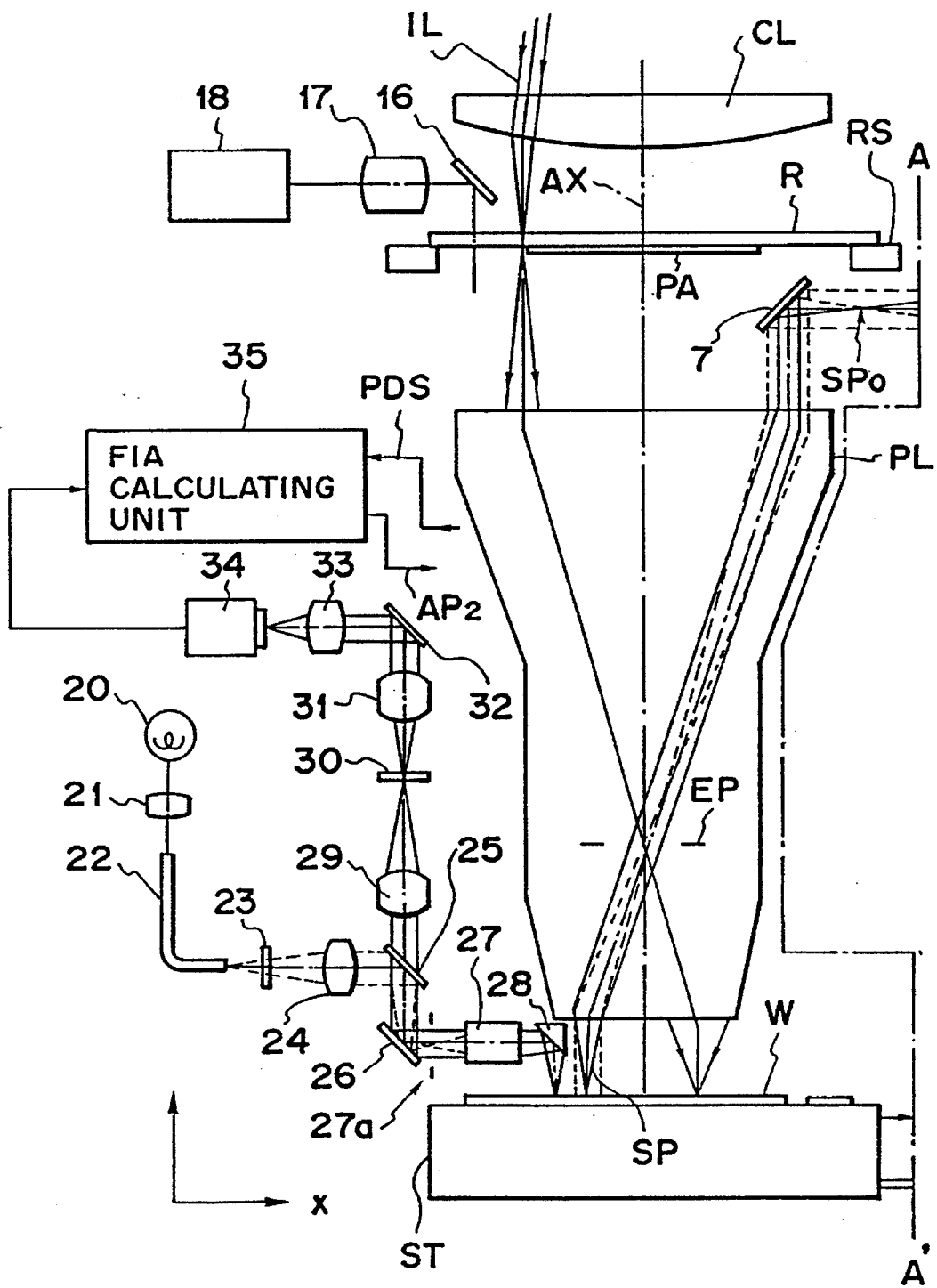
FIG. 1 is a block diagram of a reduction projection exposure apparatus in which an aligning method, constituting a first embodiment of the present invention, is applicable.
Figure 2:
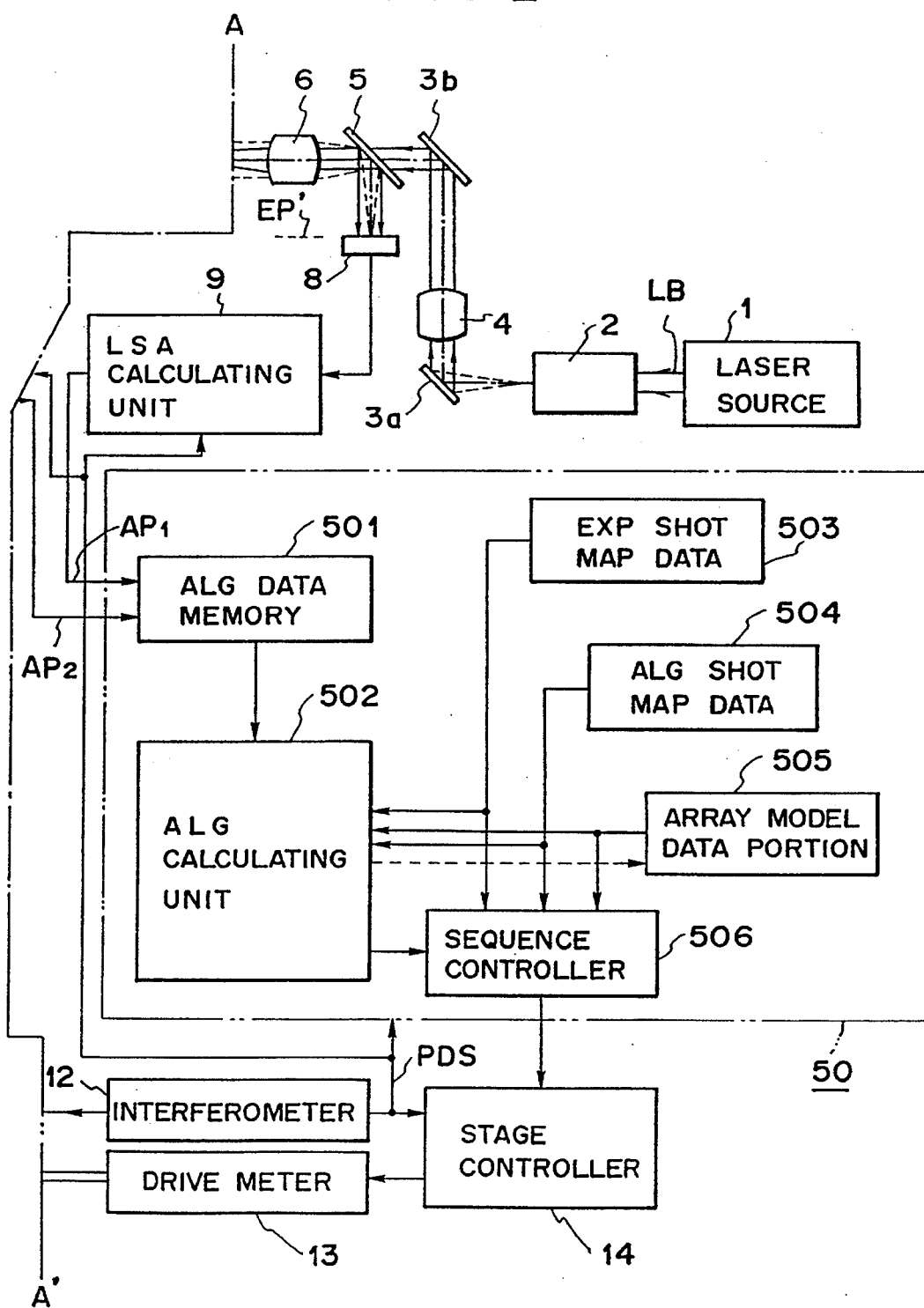
FIG. 2 is a block diagram similar to FIG. 1.

FIGS. 1 and 2 are block diagrams, mutually connected by a line A—A', showing a reduction projection exposure apparatus (stepper) in which an aligning method, constituting a first embodiment of the present invention, is applicable. In the following there will-be outlined the configuration of the stepper, prior to the description of the alignment method of the first embodiment.

Referring to FIGS. 1 and 2, an illuminating light IL for exposure (for example g- or i-line light from a mercury lamp or an ultraviolet pulsed light from an excimer laser) is transmitted by a condenser lens CL and irradiates, with a substantially uniform illumination intensity, a pattern area PA of a reticle R, constituting an original for projection. The illuminating light IL transmitted by the pattern area PA enters a projection lens PL which is telecentric on both sides (or on one side), and reaches the wafer (semiconductor substrate) W through said lens PL.

The projection lens PL is corrected for the color aberration at the wavelength of the illuminating light, and the reticle R and the wafer W are in mutually conjugate positions. The illuminating light IL constitutes Kehler illumination, and forms a secondary light source image of the vicinity of the exit end of a fly's eye lens (not shown) on the pupil plane EP of the projection lens PL.

The reticle R is supported on a reticle stage RS which is two-dimensionally movable in a plane, substantially perpendicular to the plane of the drawings of FIGS. 1 and 2. The reticle R is aligned with respect to the optical axis AX of the projection lens PL, by the detection of an alignment mark (not shown), formed on the periphery of the reticle R, by means of a reticle alignment system consisting of a mirror 16, an objective lens 17 and a mark detection system 18.

The wafer W is supported on a wafer stage ST which is two-dimensionally movable by a drive system 13. The coordinate values of said wafer stage ST are measured from time to time by a laser interferometer 12. Though only one interferometer is illustrated, another interferometer is provided also in the perpendicular direction. A stage controller 14 controls the drive system 13 according to the coordinate values of the wafer stage ST, measured by the interferometer 12, thereby moving and positioning the wafer stage ST.

The stepper of the present embodiment is provided with an alignment optical system of through-the-lens (TTL) method, and an alignment optical system of off-axis method.

At first there will be explained the alignment optical system of the TTL method. Referring to FIGS. 1 and 2, a laser unit 1, composed for example of an He—Ne laser, emits a red laser beam LB, which does not affect the photoresist layer on the wafer W. Said beam LB is transmitted by a beam shaping optical system 2 including a cylindrical lens etc., then guided through a mirror 3a, a lens system 4, a mirror 3b and a beam splitter 5, and enters an objective lens 6. Emerging from said objective lens 6, the beam LB is reflected downwards by a mirror 7 provided at an angle of 45° below the reticle R, and enters a peripheral part of the field of the projection lens PL, parallel to the optical axis AX thereof. The beam LB passes the center of the pupil EP of the projection lens PL, and, emerging therefrom, perpendicularly irradiates the wafer W.

By means of the beam shaping optical system 2, the beam LB is condensed into a slit-shaped spot $SP_0$ in the optical path between the objective lens 6 and the projection lens PL, by the function of the projection lens PL, a similar spot SP is focused again, in a form extended in the x-direction, on the wafer W.

The mirror 7 provided below the reticle R is fixed in a position which is outside the pattern area PA of the reticle R but inside the field of the projection lens PL. Consequently the light spot SP formed on the wafer W is positioned outside the image of the pattern area PA projected similarly onto the wafer W.

At each shot area on the wafer W, there is formed an alignment mark (not shown in FIGS. 1 and 2), consisting of plural diffraction grating marks, each of which is composed of plural dot patterns arranged in the x-direction and which are arranged with a predetermined pitch in the y-direction (substantially perpendicular to the plane of FIGS. 1 and 2). Thus, when said alignment mark is scanned in the y-direction by the light spot SP by a horizontal movement of the wafer stage ST with respect to the light spot SP, said mark generates normally reflected light, scattered light and diffracted light, of which intensity varies according to the relative positional relationship between said mark and the light spot SP. The details of said mark will be explained later.

The light reflected from the alignment mark inversely proceeds along the above-explained path of the beam LB, then is transmitted by the projection lens PL, mirror 7 and objective lens 6, and is reflected by the beam splitter 5 to a photosensor 8, of which light-receiving face is positioned substantially conjugate to the pupil EP of the projection lens PL. The photosensor 8 does not react to the normally reflected light from the mark but only to the scattered and diffracted light, and generates a corresponding electrical signal.

The output signal from the photosensor 8 is introduced, together with a position detection signal PDS from the interferometer 12, into a laser step alignment (LSA) calculation unit 9. Said unit 9 samples and stores the signal wave form received from the photosensor 8 at the relative scanning of the alignment mark by the light spot SP, together with the position detection signal PDS, and analyzes said wave form, thereby generating a signal $AP_1$ indicating the coordinate position (in the y-direction) of the wafer stage ST when the center of the mark coincides with the center of the light spot.

Though FIGS. 1 and 2 illustrate only one TTL alignment optical system, another TTL alignment optical system is provided in the orthogonal y-direction, for detecting an alignment mark extening the x-direction of the wafer W, by means of a light spot extended in the y-direction.

Explained in the following is the off-axis alignment optical system. Referring to FIGS. 1 and 2, light emitted by a halogen lamp 20 is condensed by a condenser lens 21 onto an end face of an optical fiber 22. The light guided by the optical fiber 22 is transmitted by a filter 23 which cuts off the photosensitive spectral range (shorter wavelength region) of the photoresist layer and the infrared wavelength region, and is guided to a half mirror 25 through a lens system 24. After being reflected by said mirror 25, the light is again reflected by a mirror 26, then proceeds substantially parallel to the wafer W to an objective lens 27, is again reflected by a prism (mirror) 28 positioned in a peripheral part below the projection lens PL so as to hinder the field thereof, and perpendicularly irradiates the wafer W.

Though not shown in FIGS. 1 and 2, a field diaphragm is provided, in the optical path from the exit end of the optical fiber 22 to the objective lens 27, in a position conjugate with the wafer W across the objective lens 27. The objective lens 27, is constructed as a telecentric system, and, on a diaphragm 27a thereof (equivalent to pupil) an image of the exit end of the optical fiber 22 is formed to effect Kehler illumination. The optical axis of said objective lens 27 is fixed perpendicularly to the wafer W, in order to avoid error in the mark detection position, resulting from the inclination of the optical axis, at the mark detection.

The light from said objective lens 27 irradiates the alignment mark on the wafer W, and the light reflected from said alignment mark inversely proceeds along the above-explained optical path, then is guided through the prism 28, objective lens 27 and mirror 26, further transmitted by the half mirror 25 and is focused onto an index plate 30 through a lens system 29. Said index plate 30 is positioned conjugate with the wafer W across the objective lens 27 and the lens system 29, and the image of the mark of the wafer W is focused in a transparent window formed in said index plate 30. In said transparent window of the index plate 30, there are formed linear index marks extending respectively in the x-direction shown in FIGS. 1 and 2 and in the y-direction perpendicular to the plane of drawing. Said mark image and the index marks are focused, through relay systems 31, 33 and a mirror 32, onto the light-receiving face of an image sensor, device 34 such as a CCD.

The output-video signal from said image sensor device 34 is supplied, together with the position detection signal PDS from the interferometer 12, to a field image alignment (FIA) calculation unit 35, which determines the aberration of the mark image with respect to the index marks based on the wave form of the video signal from the image sensor device 34, and generates a signal $AP_2$ indicating the coordinate position of the wafer stage ST when the mark image is positioned precisely at the center of the index marks.

Though FIGS. 1 and 2 illustrate only one off-axis alignment optical system, another off-axis alignment optical system is also provided in the orthogonal y-direction, in order to detect the alignment mark extending in the x-direction of the wafer W.

In the following there will be explained a main control system 50 which integrally controls the above-explained alignment optical systems and a stage controller 14.

The main control system 50 constantly receives the position information PDS from the interferometer 12. Referring to FIGS. 1 and 2, an aligning (ALG) data memory unit 501 stores the mark position information $AP_1$ from the LSA calculation unit 9 and the mark position information $AP_2$ from the FIA calculation unit 35. An ALG calculation unit 502 calculates the actual coordinate values of the shot arrangement on the wafer W, based on the mark position information stored in the ALG data memory 501, and sends the result of said calculation to a sequence controller 506. The details of the calculating procedure in the ALG calculation unit 502 will be explained later.

An exposure (EXP) shot map data unit 503 stores the set coordinate values of the shot arrangement to be exposed on the wafer W.

Figure 5:
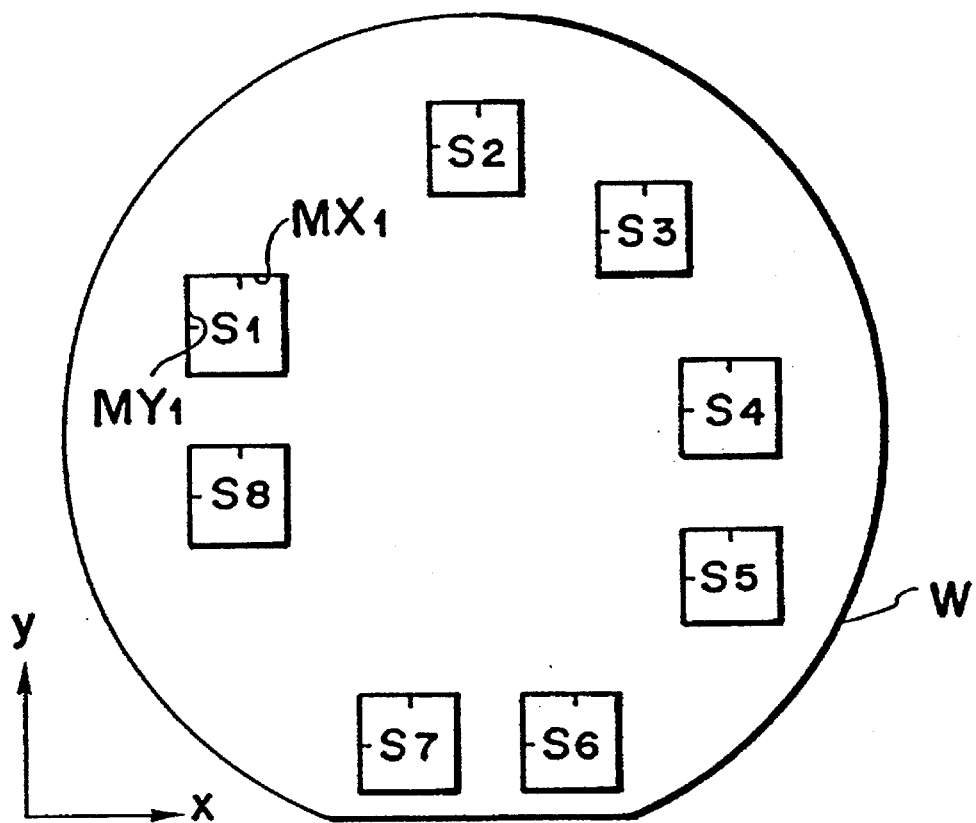
FIG. 5 is a plan view showing shot areas selected for alignment.

An aligning (ALG) shot map data unit 504 stores the set coordinate values of the shot arrangement to be aligned on the wafer W. The number and positions of the shot area to be aligned (hereinafter called specified shot areas) are so determined in advance as to satisfy the precision of alignment and the throughput of the entire exposure apparatus. In the present embodiment, as shown in FIG. 5, eight shot areas $S_1$–$S_8$ are selected as the specified shot areas.

The number and positions of the specified shot areas may be set in the ALG shot map data unit 504 by the operator through an input device (such as an unrepresented keyboard), or automatically set by the sequence controller 506. The specified shot areas may be selected empirically, based on the wafer, underlying surface, kind of photoresist (and thickness thereof) and wafer process conditions (such as heating temperature and time), or by experiment or simulation. A practical method for determining the number and positions of the specified shot areas consists of evenly selecting shot areas in the peripheral area of the wafer so as to form a regular polygon by said selected shot areas, in consideration of the throughput. This method allows determining the parameters a–f explained later, with a satisfactory precision. Naturally the number and positions of the specified shot areas may be different for every wafer, or every lot, or every predetermined number of wafers.

An array model data unit 505 stores a model of the shot arrangement on the wafer, in advance. The details of said unit 505 will also be explained later. The sequence controller 506 determines the sequence for movement control of the wafer stage ST in the alignment or in the step-and-repeat exposures.

Figure 3:
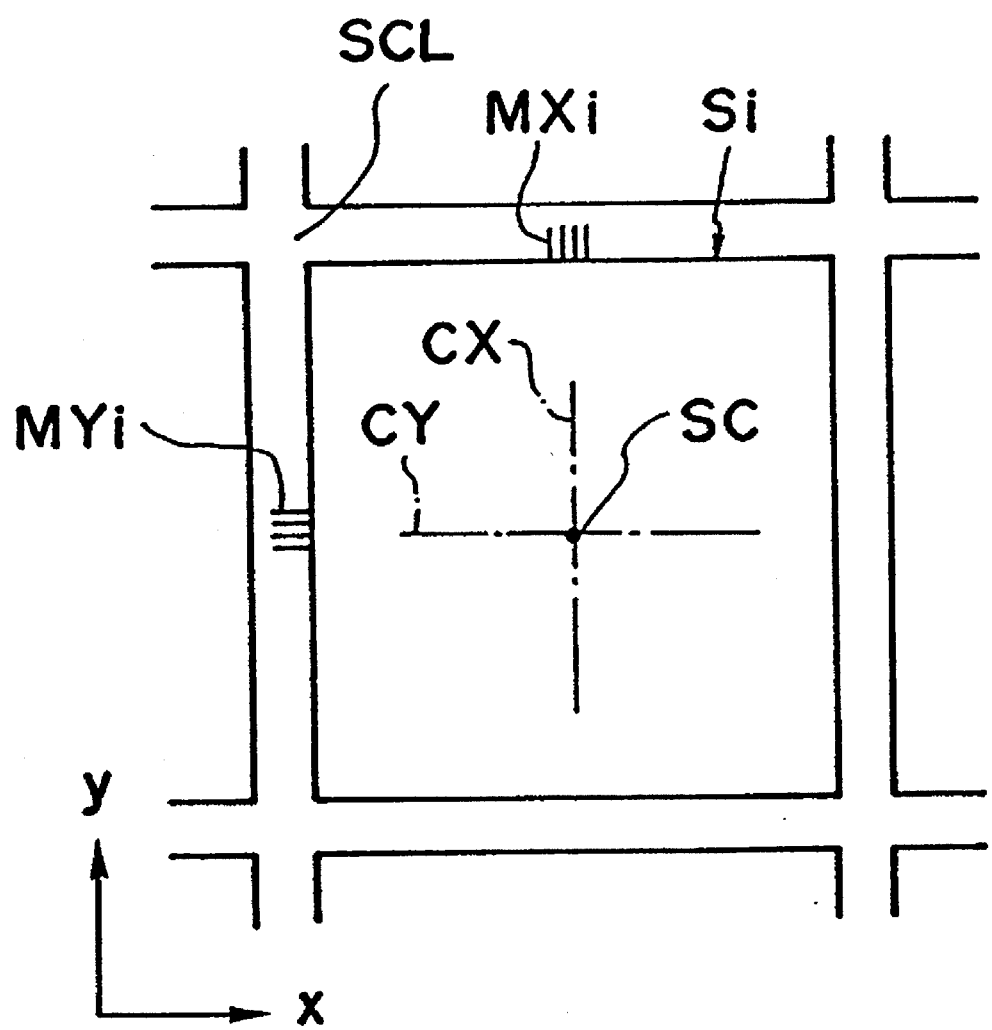
FIG. 3 is a plan view showing a shot area and alignment marks on a wafer.

FIG. 3 illustrates the relationship between a shot areas $S_i$ (i=1, ..., n) and alignment marks $MX_i$, $MY_i$ on the wafer W. A shot area $S_i$, to be exposed to the pattern area PA of the reticle R, is surrounded at four sides with scribe lines SCL, and, at the centers of mutually perpendicular two scribe lines SCL, there are respectively formed alignment marks $MX_i$, $MY_i$.

The mark $MX_i$ is used for position detection in the x-direction, while the mark $MY_i$ is used for position detection in the y-direction. Each of said marks $MX_i$, $MY_i$ consists of plural diffraction grating marks, each of which is composed of dot patterns arranged in a direction perpendicular to the measuring direction and which are arranged with a predetermined pitch in the measuring direction.

The alignment in the present embodiment is achieved by detecting said alignment marks $MX_i$, $MY_i$ commonly by the TTL alignment optical systems and by the off-axis alignment optical systems. As explained above, each of the alignment marks $MX_i$, $MY_i$ is formed at the center of one of the sides surrounding the shot areas $S_i$, and the coordinate values of the center of said shot area $S_i$ can be determined from the coordinate values of said alignment marks $MX_i$, $MY_i$ when said alignment marks are aligned. In the following description the coordinate values of the alignment marks $MX_i$, $MY_i$ are equivalent to those of the shot area $S_i$.

Figure 4:
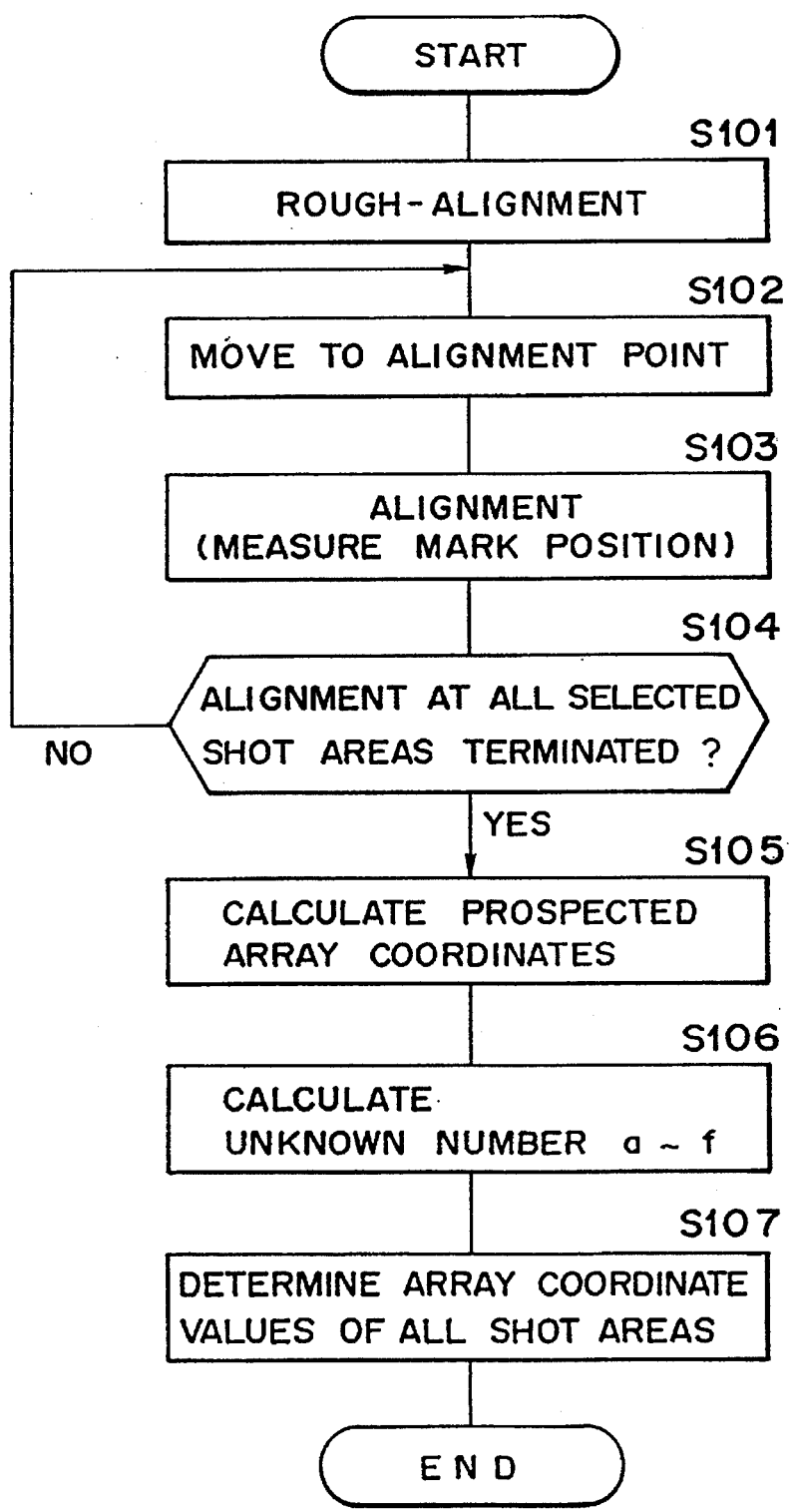
FIG. 4 is a flow chart showing the control sequence of the first embodiment.

In the following there will be described the aligning method of the present invention, together with the function of the apparatus, with reference to FIGS. 1 to 3 and a flow chart shown in FIG. 4. Said aligning operation is executed prior to a superposed exposure for the second or subsequent mark on the wafer W, and it is therefore assumed that the wafer W already bears thereon chip patterns (corresponding to shot areas) and alignment marks. In the following there is explained an operation of superposed exposure by a second reticle onto the wafer W.

At first, in a step S101, the wafer W is loaded on the wafer stage ST and is roughly aligned (for example±2 μm).

Then a step S102 moves the wafer W according to the shot array coordinates stores in the ALG shot map data unit 504, whereby the specified shot areas $S_1$–$S_8$ for alignment, selected in advance, are aligned in succession, with respect to the mark detecting position (light spot SP) of the TTL alignment system. More specifically, the sequence controller 506 moves the wafer stage ST through the stage controller 14, thereby moving the wafer W to a position where the alignment marks $MX_i$, $MY_i$ are irradiated by the light spots SP of the TTL alignment optical systems.

A next step S103 executes an aligning operation by the TTL alignment optical systems, according to the above-explained procedure. In this state, the position information from the interferometer 12 is temporarily stored, as the coordinate position signal $AP_1$, in the ALG data memory 501.

A step S104 discriminates whether the movement and the measurement of coordinate position have been completed for all the specified shot areas $S_1$–$S_8$, and, if completed, the sequence proceeds to a step S105, but, if not, the sequence returns to the step S102 for effecting the alignment for a next shot area $S_i$.

In the step S105, the ALG calculation unit 502 reads the set coordinate values ($x_i$, $y_i$) of the array of the alignment marks stored in advance in the ALG shot data unit 504, and calculates and stores the anticipated coordinate values ($x_i'$, $y_i'$) according to the shot array model.

A feature of the present embodiment lies in this shot array model. It is assumed that the coordinate system (x, y) of shot array on the substrate is transformed into (x',y') for example by a thermal treatment, and the relation therebetween is defined by:

$$\begin{pmatrix} x' \\ y' \end{pmatrix} = \begin{pmatrix} F(x, y) \\ G(x, y) \end{pmatrix} \qquad (5)$$

The functions F, G, for transforming (x, y) into (x', y'), can assume an arbitrary form such as a polynomial of second or higher order, a trigonometrical function or an exponential function, so as to exactly represent the deformation in the process. Said functions F, G are mathematically determined in empirical manner, or by experiment or simulation and are stored in the array model data unit 505, prior to the aligning operation. Said model functions F, G are preferably determined for each wafer, according to the wafer material, underlying surface, conditions of wafer process etc. However, since these conditions can be considered substantially the same for a given kind of wafer in a given process, said functions F, G are to be determined for each kind of wafer and each process step.

It is to be noted that the calculation of the anticipated coordinates ($x_i'$, $y_i'$) in the step S105 does not require the measured coodinate values ($x_{Mi}$, $y_{Mi}$) of the alignment marks. Consequently the determination of the anticipated coordinate values ($x_i'$, $y_i'$) may be made any time before the completion of measurement of the coordinate positions of the marks on all the specified shot areas. Thus the calculation of said anticipated coordinate values ($x_i'$, $y_i'$) may be made simultaneously with the aligning operation, or prior to the aligning operation.

A next step S106 determines a transformation model for determining the coordinate values of the shot areas at the exposure operation, based on the measured coordinate values ($x_{Mi}$, $y_{Mi}$) of the alignment marks stored in the ALG data memory 501 and the anticipated coordinate values ($x_i'$, $y_i'$) stored in the ALG calculation unit 502.

Between the anticipated array coordinate system (x', y') reflecting the influence (particularly non-linear distortion) of thermal process based on the shot array model and the actual shot array coordinate system (X, Y) in the stage coordinate system, there should have been developed errors by rotation, linear elongation or contraction, off-set etc. as explained before, and these errors are considered to be represented by first-order approximation, as also explained before. Consequently, the transformation from the coordinate system (x', y') of the anticipated array to the coordinate system (X, Y) of the actual shot array can be defined, in a similar manner as (1), by:

$$\begin{pmatrix} X \\ Y \end{pmatrix} = \begin{pmatrix} a & b \\ c & d \end{pmatrix} \begin{pmatrix} x' \\ y' \end{pmatrix} + \begin{pmatrix} e \\ f \end{pmatrix} \qquad (6)$$

Thus the ALG calculation unit 502 calculates the coordinate values ($X_i$, $Y_i$) of the shot array in the stage coordinate system by substituting the anticipated coordinate values ($X'_i$–$Y'_i$) of the alignment marks into the equation (6), then calculates the alignment errors or difference ($\Delta x$, $\Delta y$) of said coordinate values ($X_i$, $Y_i$) of the shot array from the measured values ($x_{Mi}$, $y_{Mi}$) at the alignment, partially differentiates said alignment errors with the parameters a–f in the equation (6) and solves the simultaneous equations obtained by placing the obtained partial differentials equal to zero, thereby determining said parameters a–f, which are memorized in the ALG calculation unit 502.

Then a step S107 determines the exposure coordinate values according to the first-order transformation equation determined in the step S106. The ALG calculation unit 502 reads, in succession, the design coordinate values ($x_{ci}$, $y_{ci}$) of the shot areas to be exposed, from the EXP shot map data unit 503, then calculates the anticipated coordinate values for all the shot areas $S_i$ on the wafer W in a similar manner as in the step S105, then calculates the actual coordinate values ($X_{ci}$, $Y_{ci}$), in the stage coordinate system, for all the shot areas on the wafer W according to the first-order transformation equation (6) determined in the step S106, and sends the obtained coordinate values in succession to the sequence controller 506. In response the sequence controller 506 effects the stepping operations of the wafer stage ST through the stage controller 14. In this manner the wafer stage ST is stepped in such a manner that each shot area on the wafer W coincides with the projected image of the pattern area PA of the reticle R, whereby the superposed exposure is conducted.

As explained in the foregoing, the present embodiment determines a shot array model in advance, and enables first-order approximation in the transformation from the substrate coordinate system to the stage coordinate system by means of said shot array model, so that the number of parameters to be calculated after the alignment operation is the same as in the conventional first-order transformation model. It is therefore rendered possible to reduce the number of the specified shot areas for measuring the positions of the alignment marks, and to achieve the substrate alignment without sacrificing the throughput of the entire exposure apparatus. Besides the tranformation equation of the present embodiment can sufficiently handle the non-linear distortion of the substrate, that cannot be coped with in the conventional first-order transformation model, thus realizing an excellent precision of alignment.

[2nd embodiment]

Figure 6:
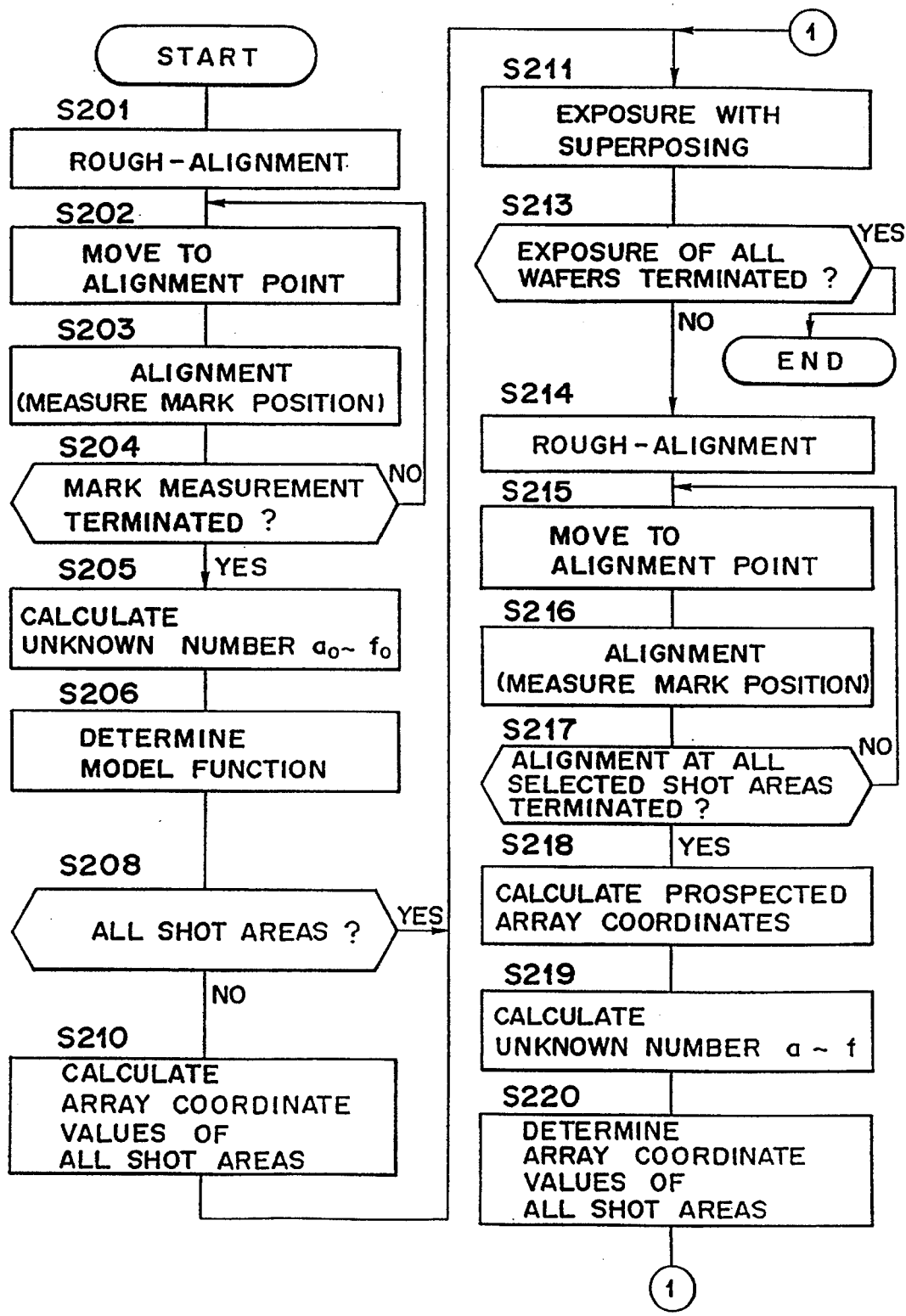
FIG. 6 is a flow chart showing the control sequence of an aligning method constituting a second embodiment of the present invention.

FIG. 6 is a flow chart of a second embodiment of the aligning method of the present invention. The exposure apparatus (stepper) in which the present embodiment is applied is identical with that of the first embodiment. Consequently the components of the stepper are represented by the same numbers or symbols, and the configuration of the stepper will not be explained.

The present embodiment is featured by execution at first of alignment and measurement of coordinate positions on plural shot areas (hereinafter called designated shot areas) including the above-mentioned specified shot areas $S_1$–$S_8$, in order to determine the shot array model (model functions). Among the number β of the designated shot areas, number α of the specified shot areas (α being 8 in this embodiment) and number n of all the shot areas on the wafer, there generally stands a relation:

(3≦)α≦β≦n.

The number β of the designated shot areas may be so selected as to enable precise calculation of the model functions F, G corresponding to the elongation or contraction (particularly non-linear distortion) of the wafer. In the determination of said number β, a condition β=n, namely the alignment operations on all the shot areas is not essential, but is desirable for improving the precision of alignment. In case the alignment and the measurement of coordinate positions are conducted for all the shot areas, the superposed exposures on a first wafer $W_1$ can be executed directly according to the measured values, but, if such alignment and coordinate measurement are not conducted on all the shot areas, there have to be followed the determination of model functions and the calculation of unknown parameters as will be explained later. The following description will be given on an assumption β<n.

In the method explained in the following, the coordinate positions of the alignment marks of the designated shot areas are measured on a first wafer $W_1$ in a lot containing plural wafers $W_1$–$W_m$, and the model functions F, G determined from the measured data are applied also to the second and subsequent wafers $W_{2-Wm}$ in said lot.

(1) For the first wafer $W_1$:

In a first step $201, the first wafer $W_1$ of the lot is loaded on the wafer stage ST and roughly aligned.

A next step S202 moves the wafer W according to the coordinate values of the shot array stored in the ALG shot map data unit 504, whereby the designated shot areas $S_i$ are aligned, in succession, to the mark detecting positions (light spots SP) of the TTL alignment optical systems.

A step S203 effects alignment utilizing the TTL alignment optical systems. In this state the position information from the interferometer 12 is temporarily stored, as the coordinate position signal $AP_1$, in the ALG data memory 501.

A step S204 discriminates whether the movement and the measurement of coordinate positions have been completed for all the designated shot areas $S_i$, and, if completed, the sequence proceeds to a step S205, but, if not, the sequence returns to the step S202 for effecting the alignment for a next shot area $S_i$.

A step S205 temporarily calculates the unknown parameters of the above-mentioned first-order transformation model. More specifically, the ALG calculation unit 502 reads the measured coordinate values ($x_{pi}$, $y_{pi}$) of the designated shot areas, stored in the ALG data memory 501, then also reads the set coordinate values ($x_i$, $y_i$) of the designated shot areas $S_i$ from the ALG shot map data unit 504, and calculates temporary (calculational) coordinate values ($X_{pi}$, $Y_{pi}$) in the stage coordinate system, by substituting the above-mentioned data into the equation (1).

Then said unit 502 calculates the differences ($\Delta x_p$, $\Delta y_p$) between the temporary coordinate values ($X_{pi}$, $Y_{pi}$) on the stage coordinate system and the measured values ($x_{pi}$, $y_{pi}$) at the alignment, then partially differentiating said alignment errors with the parameters a–f, and solves the simultaneous equations obtained by placing the obtained differentials equal to zero, thereby determining the parameters a–f. The parameters determined in this step S205 shall be hereinafter represented as $a_0$–$f_0$.

A step S206 determines the model functions F, G of the shot array model, according to said parameters $a_0$–$f_0$, and stores said model functions in the array model data unit 505.

As explained before, the errors in the calculated coordinate values on the stage coordinate system include, for example, the rotational error θ when the wafer is placed on the stage ST and the linear dilatations Rx, Ry resulting from the wafer temperature. Thus, the alignment errors in the calculated coordinate values on the stage coordinate system include components unreproducible in the repeated measurements. However, such unreproducible components can be considered to be represented first-order approximation as explained also in the foregoing, and, stated inversely, the reproducible components can be considered ascribable for example to a preceding thermal process. Therefore, in the present embodiment, the reproducible components alone, that cannot be represented by first-order approximation, are extracted as the shot array model. More specifically there are given equations:

$$\begin{pmatrix} \Delta x_i \\ \Delta y_i \end{pmatrix} = \begin{pmatrix} x_{pi} \\ y_{pi} \end{pmatrix} - \left\{ \begin{pmatrix} a_0 & b_0 \\ c_0 & d_0 \end{pmatrix} \begin{pmatrix} x_i \\ y_i \end{pmatrix} + \begin{pmatrix} e_0 \\ f_0 \end{pmatrix} \right\} \quad (7)$$

$$(i = 1, \ldots, \beta)$$

$$\begin{pmatrix} x'_i \\ y'_i \end{pmatrix} = \begin{pmatrix} x_i \\ y_i \end{pmatrix} + \begin{pmatrix} \Delta x_i \\ \Delta y_i \end{pmatrix} \quad (8)$$

$$(i = 1, \ldots, \beta)$$

and the anticipated coordinate values $(x'_i, y'_i)$ of the alignment marks are at first determined by these equations from the set coordinate values of the alignment marks.

Then, in order to determine the anticipated coordinate values $(x'_{ci}, y'_{ci})$ of the shot area array from the set coordinate values $(x_{ci}, y_{ci})$ thereof, it is assumed that the distance between the alignment marks of a shot area and the center thereof is constant for all the shot areas, because said distance is very short. Based on this assumption, the above-mentioned coordinate values can be mutually correlated by:

$$\begin{pmatrix} x'_{ci} \\ y'_{ci} \end{pmatrix} = \begin{pmatrix} x_{ci} \\ y_{ci} \end{pmatrix} + \begin{pmatrix} \Delta x_i \\ \Delta y_i \end{pmatrix} \quad (9)$$

$$(i = 1, \ldots, \beta)$$

These equations (7) to (9) are stored in the array model data unit 505.

A step S208 discriminates whether the designated shot areas constitute all the shot areas on the wafer $W_1$, and the sequence proceeds to a step S211 or S210 respectively if the result of said discrimination is affirmative or negative. Since the present embodiment is based on an assumption β<n, the sequence proceeds to the step S210.

The step S210 determines the coordinate values for all the shot areas on the wafer $W_1$. Since the equations (7) to (9) are valid only in the designated shot areas $S_i$ (i=1–β) which are less than all the shot areas (B<n), the above-mentioned determination requires functions for calculating the coordinate values in the remaining shot areas $S_i$ (i=β+1–n).

For example, the functions for a shot area $S_r$ (n>γ>β) can be represented as:

$$\begin{pmatrix} \Delta x_\gamma \\ \Delta y_\gamma \end{pmatrix} = \begin{pmatrix} 1/(1_R+1_L) & 0 \\ 0 & 1/(1_U+1_D) \end{pmatrix} \begin{pmatrix} 1_R \times \Delta x_L & 1_R \times \Delta x_R \\ 1_D \times \Delta y_U & 1_U \times \Delta y_D \end{pmatrix} \quad (10)$$

wherein L, R, U and D are designated shot areas (≤β) closest to the shot area $S_r$ respectively at left, at right, in upper and lower direction; and $1_L$, $1_R$, $1_U$ and $1_D$ are distances to said designated shot areas. Thus the equations can be determined for all the shot areas, and the equations (7) and (9) for i=1–β can be expanded to (7'), (9') for i=1–n $$\begin{pmatrix} \Delta x_i \\ \Delta y_i \end{pmatrix} = \begin{pmatrix} x_{pi} \\ y_{pi} \end{pmatrix} - \left\{ \begin{pmatrix} a_0 & b_0 \\ c_0 & d_0 \end{pmatrix} \begin{pmatrix} x_i \\ y_i \end{pmatrix} + \begin{pmatrix} e_0 \\ f_0 \end{pmatrix} \right\} \quad (7')$$

$$(i = 1, \ldots, n)$$

$$\begin{pmatrix} x'_{ci} \\ y'_{ci} \end{pmatrix} = \begin{pmatrix} x_{ci} \\ y_{ci} \end{pmatrix} + \begin{pmatrix} \Delta x_i \\ \Delta y_i \end{pmatrix} \quad (9')$$

$$(i = 1, \ldots, n)$$

These equations are stored in the array model data unit 505.

In a step S211, the ALG calculation unit 502 determines the anticipated coordinate values $(x'_{ci}, y'_{ci})$ according to the equations (7) and (9) if β=n, or the equations (7') and (9') if β<n, and calculates the exposure coordinate values $(X_{ci}, Y_{ci})$ according to the equation (6) utilizing the parameters $a_0$–$f_0$ determined in the step S205. Thus the wafer stage ST is stepped by the sequence controller 506 and the stage controller 14 in such a manner that the shot areas $S_i$ on the wafer $W_1$ are superposed in succession with the projected image of the pattern area PA of the reticle R, and the superposed exposures are thus achieved.

(2) For the second and subsequent wafers $W_2$–$W_m$:

A step S213 discriminates whether the superposed exposure operation has been completed for all the wafers in the lot, and, if completed, the sequence is terminated, but, if not, the sequence proceeds to a step S214. In the present situation, since the superposed exposure is completed only for the first wafer, the sequence proceeds to the step S214.

In the step S214, a second wafer $W_2$ of the lot is loaded on the wafer stage ST and is roughly aligned.

A next step S215 moves the wafer $W_2$ according to the coordinate values of the array stored in the ALG shot map data unit 504, whereby the specified shot areas $S_1$–$S_8$ are aligned in succession to the mark detecting positions (light spots SP) of the TTL alignment optical systems.

A next step S216 executes the alignment operation, utilizing the TTL alignment optical systems. In this state, the position information from the interferometer 12 is temporarily stored, as the coordinate position signal $AP_1$, in the ALG data memory 501.

A step S217 discriminates whether the movement and the measurement of coordinate position have been completed for all the specified shot areas $S_1$–$S_8$, and, if completed, the sequence proceeds to a step S218, but, if not, the sequence returns to the step S215 for executing the alignment for a next shot area $S_i$.

The step S218 calculates the anticipated coordinate values for the alignment marks, according to the shot array model determined in the step S206. More specifically, the ALG calculation unit 502 reads the design coordinate values $(x_i, y_i)$ of the alignment marks stored in advance in the ALG shot map data unit 504, and calculates the anticipated coordinate values $(x'_i, y'_i)$ of the alignment marks. Thus calculated values are stored in the ALG calculation unit 502.

Also the calculation of the anticipated coordinate values $(x'_i, y'_i)$ of the alignment marks in this step does not require the measured coordinate values $(x_{Mi}, y_{Mi})$ of the alignment marks obtained in the step S216. Consequently the determination of said anticipated coordinate value may be made any time before the completion of measurement of the coordinate values of alignment marks for all the specified shot areas.

In a next step S219, the ALG calculation unit 502 calculates the difference, or the alignment error ($\Delta x$, $\Delta y$) between the coordinate values ($X_i$, $Y_i$) on the stage coordinate system and the measured values ($x_{Mi}$, $y_{Mi}$) at the alignment, then partially differentiates said alignment error with the parameters a–f in the equation (6), and solves the simultaneous equations obtained by placing said partial differentials equal to zero, thereby determining said parameters a–f. The parameters calculated in the step S219 will hereinafter be represented as $a_2$–$f_2$, which are also stored in the ALG calculation unit 502.

A step S220 determines the exposure coordinate values according to the first-order transformation equations determined in the step S219. More specifically, the ALG calculation unit 502 reads, in succession, the design coordinate values ($x_{ci}$, $y_{ci}$) of the shot areas to be exposed, from the EXP shot map data unit 503, then calculates the anticipated coordinate values according to the model equations (7)–(9) or (7') and (9') defined in the step S206 or S210, further calculates the actual coordinate values ($X_{ci}$, $Y_{ci}$) of all the shot areas on the wafer W on the stage coordinate system, and sends said values in succession to the sequence controller 506.

Thereafter the sequence returns to the step S211 for executing the superposed exposure operation, and then the step S212 renews the data in the ALG shot map data unit 504. In this manner the superposed exposure is executed by the steps S211 to S220 for all the wafers W in the lot.

In the present embodiment, the model functions determined in the step S206 for the first wafer $W_1$ are used for determining the anticipated coordinate values of the shot array in the second and subsequent wafers $W_2$–$W_m$. For this reason the steps S214 to S220 are identical with the steps S101 to S107 in the first embodiment. However, the model functions may be determined for each wafer. Also the selection of the number and positions of the specified shot areas can be made in the same manner as in the first embodiment.

Consequently the present embodiment can provide effects and advantages the same as in the first embodiment. Particularly in this embodiment, the alignment operations are once executed for the designated shot areas $S_i$ on the wafer W, and the model of array of each alignment mark is determined based on the result of such alignment operations. For this reason there is obtained an advantage that, even in case only one shot area is subjected to a deformation in a different manner from other shot areas, the alignment operation can be so conducted as to cope with such situation. Stated differently the present embodiment is capable of alignment in a quasi-digital manner.

[Variation of second embodiment]

The sequence of the above-mentioned steps S201 to S210 maybe applied, not only to the first wafer $W_1$, but also to plural ones selected from the remaining wafers in the same lot to be subjected to the superposed exposure. For example, said sequence may be executed on each of the first to k-th wafers ($k$ being an integer; $k \leq 2$) selected from the lot. In such case, said plural wafers respectively provide equations $(7_1)$, $(7_2)$, ... corresponding to the equation (7) of the array model to be used in the subsequent calculations. Therefore, the array model (model functions) may be calculated from the average, for each designated shot area, of the left-hand terms ($\Delta x_i$, $\Delta y_i$) obtained from said equations $(7_1)$, $(7_2)$, .... More precisely, for each wafer $W_k$ up to the k-th wafer, there are employed model functions calculated from the average of the left-hand term ($\Delta x'_i$, $\Delta y'_i$) in the equation (7) in each of the wafers $W_1$ to $W_{k-1}$, and, for each of the wafers $W_{k+1}$–$W_m$ starting from the (k+1)-th wafer, there are employed model functions calculated from the average of the left-hand terms ($\Delta x'_i$, $\Delta y'_i$) obtained in the initial k wafers. The value k can be suitably determined in consideration of the precision of measurement and the desired throughput.

Such application of the steps S201 to S210 to plural wafers allows improving the precision of measurement and reducing the fluctuation of errors among the wafers. The exposure operation for each wafer subjected to said steps S201 to S210 can be determined according to the equations $(7_1)$, $(7_2)$, ... obtained in the wafers measured up to said wafer.

Also the above-explained alignment may be started, not from the first wafer in the lot, but from a t-th ($t \geq 2$) wafer. It is also possible to divide the wafers in a lot into plural blocks, each containing plural (for example about five) wafers, and to effect the above-explained alignment for each block. Also the number of wafers to be used for calculating the model functions F, G is not limited to one in each block.

As explained in the foregoing, in the second embodiment, an array model is determined for each shot area in quasi-digital manner, so that the fluctuation of model resulting for example from accuracy of the sensor can be reduced by filtering. For example, filtering is applied by the following numerical filter $$\begin{pmatrix} x_{pi}' \\ y_{pi}' \end{pmatrix} = \begin{pmatrix} \sum_{k=1}^{m} s_{ik} x_{pk} \\ \sum_{k=1}^{m} t_{ik} y_{pk} \end{pmatrix} \quad (11)$$

$$\text{wherein } \sum_{k=1}^{m} s_{ik} = 1, \sum_{k=1}^{m} t_{ik} = 1$$

to obtain new anticipated coordinate values ($x'_{pi}$, $y'_{pi}$) and these values are substituted in the foregoing equation (7). The weights $s_{ik}$, $t_{ik}$ are to correct the fluctuation resulting for example from the accuracy of the sensor, and vary according to the position of the alignment marks (for example according to the distance between a specified shot area and the wafer center, or the distance between a specified shot area and the shot area to be aligned).

Also in case the alignment in the step S203 for determining the model functions is conducted only on one wafer, it is also effective to determine the difference in the anticipated coordinate value between before and after the filtering according to equation (9), for example ($x'_{pi}$–$x_{pi}$), and to exclude the shot areas where said difference is large, from the specified shot areas in the second and subsequent wafers W. It is furthermore possible to calculate $\Sigma(x'_{pi}-x_{pi})^2$ and to increase or decrease the number of the specified shot areas in proportion to the magnitude of the result of said calculation.

On the other hand, in case the alignment of the steps S201 to S204 is conducted on plural wafers and the model functions are determined according to the result of measurement of said wafers, it is effective to calculate the non-linear components ($\Delta x'_i$, $\Delta y'_i$) of the transformation model for each wafer according to the equation (7), and to exclude the shot areas, where the anticipated coordinate value shows significant fluctuation among the wafers, from the specified shot areas in each wafer. It is furthermore possible to increase or decrease the number of the specified shot areas according to the number of the shot areas showing a large fluctuation.

The aligning method of the present invention is not limited to the foregoing embodiments but is subject to various modifications. As an example, the first-order transformation model employed in the alignment in the foregoing embodiments may be replaced by a higher-order transformation model, as represented by the equation (4).

Also in the foregoing embodiments, the equations (5) and (7) are not optimum if the alignment error ($\Delta x$, $\Delta y$) after the determination of the parameters a–f, namely the minimum value ($\Delta x_{min}$, $\Delta y_{min}$) of the alignment error (equation (2)), increases with the number of the processed wafers. In such case, it is preferable to vary the equations (5) and (7) in the course of the process in such a manner that said minimum alignment error ($\Delta x_{min}$, $\Delta y_{min}$) becomes smaller. Thus, if the minimum value of the equation (2) increases with the number of the processed wafers, it is desirable to alter the functions F, G in case of the equation (5), or to vary ($x_{pi}$, $y_{pi}$) in case of the equation (7).

Figure 7:
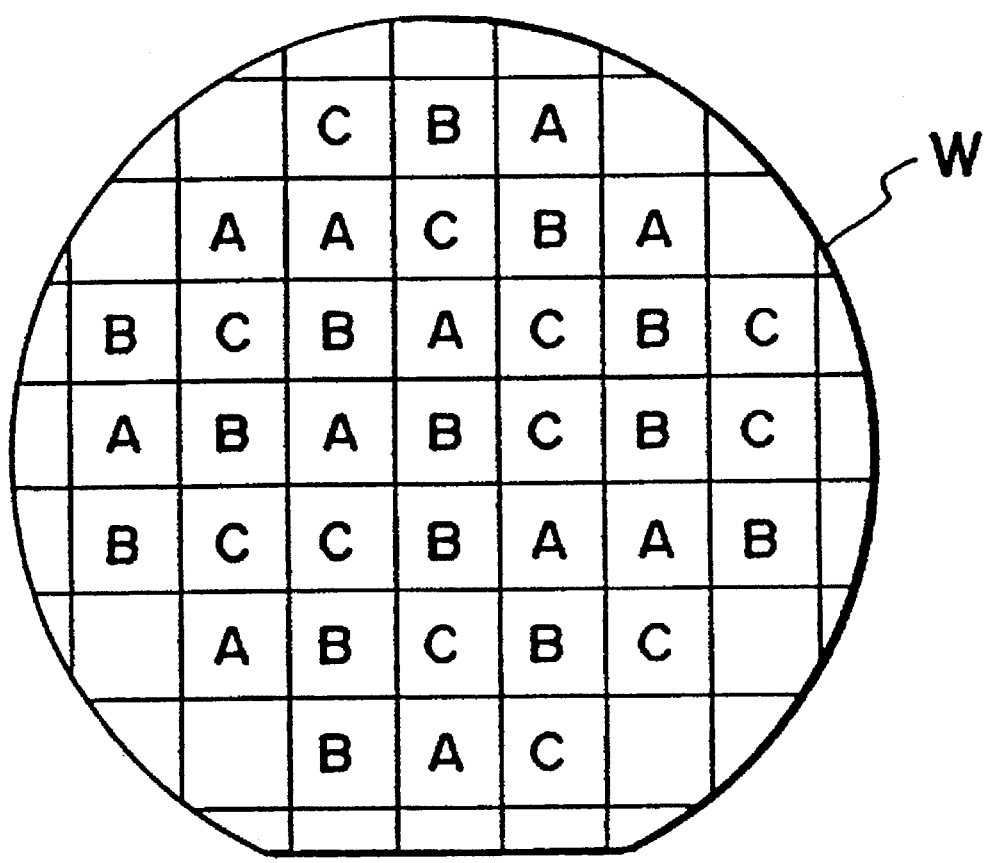
FIG. 7 is a plan view showing an example of the selecting method for alignment points.

It is furthermore possible to cancel the deviation of the model resulting from the variation in the equations (5) and (7) and to improve the adequacy of said model, by varying the alignment point in the order of A, B, C, . . . in successive wafers, as shown in FIG. 7.

In the foregoing embodiments, eight shot areas $S_1$–$S_8$ shown in FIG. 5 are selected as the specified shot areas, and the measured coordinate values ($x_{Mi}$, $y_{Mi}$) of the alignment marks associated with these eight shot areas are employed in the calculation for determining the unknown parameters a–f, but, in case the measurement is impossible due to the destruction of the mark or the measured coordinate value is evidently abnormal (large measurement error), the shot area associated with such mark may be excluded from the calculation of the parameters a–f. In such case, if the number of the shot areas becomes deficient in consideration of the precision of calculation, another shot area in the vicinity of the shot area excluded from the calculation may be employed as an alternative shot area. Otherwise, it is also possible to select about 10 to 15 shot areas as the specified shot areas, to measure the coordinate values of the alignment marks associated with such shot areas, and to select t shot areas ($3 \leq t \leq 10$~15) for effecting the above-mentioned calculation.

Also in the foregoing embodiments, the specified shot areas and the results of measurement of the marks of said areas may be displayed, for each wafer, on a display device such as a cathode ray tube. In such case, the shot area where the measurement is impossible or where the measurement error is significant may be displayed in a particularly conspicuous manner, such as inverted display. Such display facilitates the designation of the shot areas by the operator, in case the position (and number) of the specified shot areas are varied from wafer to wafer.

The model functions determined in the foregoing embodiments are applicable to the entire area of the wafer, but, if a single function cannot cover the entire area of the wafer for example because of a local distortion, it is also possible to divide the shot areas on the wafer into plural blocks and to determine the model functions for each block. In such case, since the peripheral part and the central part of a wafer may show different distortions, it is also possible to divide the wafer into the peripheral part and the central part and to define the model functions in each of said parts.

In the first and second embodiments, the final exposure coordinate values for all the shot areas are calculated after the determination of the parameters a–f in the equation (6). Stated differently, the parameters a–f are determined for each wafer. However, it is also possible, in the calculation of the exposure coordinate values for all the shot areas, to weight the measured coordinate values of each specified shot area according to the distance between a desired shot area on the wafer and said specified shot area, then to determine the parameters a–f in the equation (6) by a statistical calculation (for example minimum square method) employing thus weighted coordinate values (namely anticipated coordinate values), and to calculate the exposure coordinate values of the desired shot area utilizing thus determined parameters a–f. In this method, the above-explained calculation is repeated for each shot area on the wafer, so that the parameters a–f are determined for each shot area. In this method, a larger weight may be given to the specified shot area as the distance to the desired shot area becomes shorter.

In the following there will be explained the alignment method of the 3rd embodiment of the present invention, and the functions of the apparatus shown in FIGS. 1 to 3, with reference to flow charts shown in FIGS. 8 and 9. This alignment is to be conducted prior to the superposed exposure of the second or subsequent layer on the wafer W, on which chip patterns (corresponding to shot areas) and alignment marks are already formed. The following description assumes a superposed exposure of the second layer onto the wafer W. Since the exposure apparatus to which the following embodiment is applied is the same as that in the first and second embodiments, the components of the exposure apparatus shall be represented by the same numbers as in the foregoing embodiments, and the details of the apparatus shall not be explained further.

At first, in a step 301, the first wafer W in a lot is loaded on the wafer stage ST under the control of the sequence controller 506, and is roughly aligned, for example with a precision of ±2 µm order.

Then a step 302 moves the wafer W according to the design array coordinates of shots stored in the shot map data unit 503, whereby all the shot areas (designated shot areas) are moved in succession to the mark detecting position (light spot SP) of the TTL alignment system. More specifically, the sequence controller 506 moves the wafer stage ST through the stage controller 14, thereby moving the wafer W to a position where the alignment marks $MX_i$, $MY_i$ are irradiated by the light spots SP of the TTL alignment system.

A next step 303 executes an aligning operation by the TTL alignment optical systems, according to the above-explained procedure. In this state, the position information from the interferometer 12 is temporarily stored, as the coordinate position signal $AP_1$, in the ALG data memory 501. When the alignment is completed for all the shot areas on the first wafer of the lot (step 304), the parameters a–f for example of the first-order approximation are determined from the results of alignment of plural (at least three) specified shot areas selected in advance (for example in the peripheral area of the wafer) (step 305). More specifically, in this step, for the preselected plural specified shot areas (8 shot areas being assumed in this case), there are given design coordinates ($x_{sj}$, $y_{sj}$) (j=1, 2, . . . , 8) and corresponding measured coordinates ($X_{sj}$, $Y_{sj}$). In case of the first-order approximation, the six parameters a–f are determined by substituting the design values ($x_{sj}$, $y_{sj}$) in the coordinate (x, y) of the right-hand terms of the equation (1) and the measured values ($X_{sj}$, $Y_{sj}$) in the left-hand term, and effecting the minimum square method so as to minimize the errors represented by the equation (2).

A next step 306 determines the calculated coordinates ($X_i'$, $Y_i'$) of the shot areas by substituting thus determined six parameters and the design coordinates ($x_i$, $y_i$) (i=1, 2, 3, . . . ) of the shot areas into the right-hand terms of the equation (1) in succession. Said calculational coordinates ($X_i'$, $Y_i'$) are new coordinates of arrangement, and the deviation between the measured coordinate ($X_i$, $Y_i$) as a result of alignment of each shot area and the new coordinate ($X_i'$, $Y_i'$) represents the non-linear error that cannot be eliminated by the first-order approximation. The non-linear errors of the shot areas are stored in an EXP shot map data unit 503 (step 307). Any shot area for which said non-linear error exceeds a predetermined value (for example 0.1 μm) is exposed, in a step 309, according to the new coordinate of arrangement. On the other hand, any shot area for which said error exceeds said predetermined value is designated as a selected shot area and is memorized in the ALG shot map data unit 504 (step 308). In a step 309, the selected shot area is exposed after alignment according to the measured value $(X_i, Y_i)$ obtained after the alignment.

Thus, in the successive superposed exposures of the reticle pattern to the plural shot areas on the wafer, the selected shot areas are aligned according to the previously measured coordinates, while all other shot areas are aligned according to the new coordinates of arrangements (step 309). The exposure operation for the first wafer is completed by these exposures (step 310), and the wafer is exchanged (step 311), whereby a second wafer is placed on the stage ST.

Figure 9:
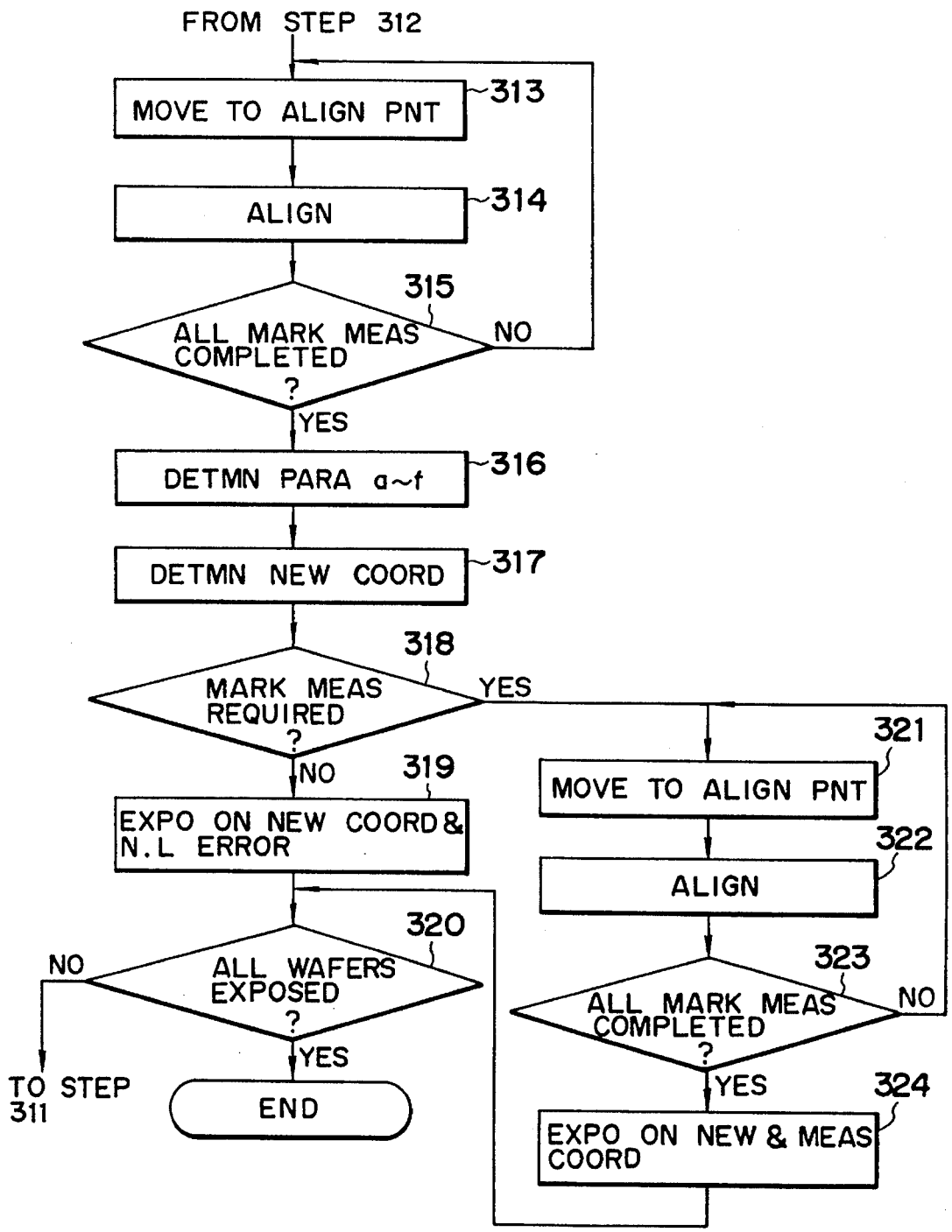

For the second or any subsequent wafer in each lot, a step 312 executes a rough alignment as in the step 310, and then the sequence proceeds to a step 313 in FIG. 9. Subsequently steps 313 to 315 execute alignment only on eight preselected shot areas (specified shot areas) as shown in FIG. 5 under the control of the sequence controller 506, thereby determining thus measured coordinates $(X_i, Y_i)$ of thus designated specified shot areas. Then a step 316 executes the minimum square method according to the design coordinates $(x_i, y_i)$ and the measured coordinates $(X_i, Y_i)$ of said specified shot areas, thereby determining, in case of first-order approximation, the six parameters a–f specific to the wafer and satisfying the equation (3).

A next step 317, in the same manner as the foregoing step 306, calculates and memorizes the calculational coordinates of each shot area as the new coordinates of arrangement, according to the equation (1) and based on the six parameters a–f and the design coordinates of the shot areas. A next step 308 discriminates whether the mark measurements are required for the shot areas (selected shot areas) of the second wafer corresponding to the selected shot areas designated in the foregoing step 308. Said discrimination may be made according to the magnitude of the non-linear error of the selected shot areas determined in the step 307. More specifically, the mark measurement is conducted for any selected shot area involving an extremely large non-linear error, and the sequence proceeds to a step 321. In the present example it is assumed that the mark measurement is identified unnecessary because the non-linear errors of the selected shot areas are not large, and the sequence proceeds to a step 319.

Said step 319 executes the superposed exposures for all the shot areas on the second wafer, based on the new coordinates of arrangement determined in the step 317 and the non-linear errors of the selected shot areas determined in the step 307. More specifically, for each of the shot areas (selected shot areas) on the second wafer, corresponding to the selected shot areas designated on the first wafer (step 308), the superposed exposure is conducted by aligning the wafer stage ST according to an arrangement coordinate by adding said non-linear error as an offset to the new or calculational coordinate specific to this second wafer. For each of all the remaining shot areas, excluding the selected shot areas, on the second wafer, the superposed exposure is executed by aligning the wafer stage ST solely according to the calculational coordinate. As a result, all the shot areas on the wafer can be exposed to the reticle pattern with a satisfactory precision of superposition, and the exposure operation for the second wafer is thus completed.

A next step 320 discriminates whether the superposed exposure has been executed on all the wafers in the lot. As the exposure operation in this state has only been made to the second wafer, the sequence returns to the step 311 to exchange the wafer, and the operations of the steps 312 to 320 are repeated for the third wafer. The exposure operation for the same lot is completed by subsequently repeating the steps 311–320 for all the remaining wafers in said lot.

On the other hand, if the step 318 identifies that the mark measurements are necessary for the selected shot areas, the sequence proceeds to a step 321, whereupon steps 321, 322 are executed to detect the mark position (coordinate position) of a selected shot area in the same manner as in the foregoing steps 302, 303. Subsequently the steps 321–323 are repeated until the mark measurements are executed for all the selected shot areas, and the sequence then proceeds to a step 324.

The step 324 executes the superposed exposures for all the shot areas on the second wafer, based on the new coordinates determined in the step 317 and the measured coordinates, detected in the steps 321–323, for all the selected shot areas. More specifically, the superposed exposure for each of the selected shot areas on the second wafer is executed by aligning the wafer stage ST according to the measured coordinate of arrangement. Also the superposed exposure for each of all the remaining shot areas, excluding the selected shot areas, is executed by aligning the wafer stage ST according to the calculational coordinate only. As a result, all the shot areas on the wafer can be exposed to the reticle pattern with a satisfactory precision of superposition, and the exposure operation for the second wafer is thus completed.

The sequence is preferably so constructed as to proceed to the step 321 in case the step 318 identifies even only one shot area involving an extremely large non-linear error. In such case the mark measurement need not necessarily be conducted on all the selected shot areas, but may be conducted only on the shot areas involving extremely large nonlinear errors, among plural selected shot areas, and those not subjected to such mark measurement may be aligned, as in the foregoing step 319, by the coordinate obtained by adding said non-linear error, as an offset, to the new coordinate of arrangement.

In the above-explained embodiment, the step 318 discriminates whether or not to effect the mark measurement for the selected shot areas, but it is also possible to determine the necessity for mark measurement in advance and to manually select the step 319 or the steps 321–324. Also in the present embodiment the mark measurement of the selected shot areas is executed in the steps 321–324, but it is also possible to effect the mark measurement of the selected shot areas as well as of the specified shot areas, for example in the step 315. Also the exposure in the step 309 is executed according to the new coordinates (calculational coordinates) for all the shot areas other than the selected shot areas, but all the shot areas on the wafer, including the selected shot areas, may be exposed according to the coordinates measured in the foregoing steps 302–304. Furthermore, in general, each shot area is associated with two sets of alignment marks for X and Y directions, and the designation of the selected shot area in the step 308 or the discrimination for the necessity of mark measurement in the step 318 may be based on whether either or both of the X and Y coordinates exceed the predetermined value.

As explained in the foregoing, in the present embodiment, all the shot areas are measured on the first wafer in a lot for determining the non-linear errors for said lot, as the differences between the measured coordinates and the new coordinates. For the second or any subsequently wafer, the specified shot areas of a predetermined number are measured for determining the parameters required for determining the new coordinates of arrangement for said wafer. The exposures for the shot areas, for which the non-linear errors are estimated to be less than a predetermined value according to the results of measurements on the first wafer, are executed according to said new coordinates of arrangement. On the other hand, on the second or any subsequent wafer, the exposures for the shot areas, for which the non-linear errors are larger according to the results of measurements on the first wafer, are executed according to the coordinates obtained by adding the non-linear errors to the new coordinates, or according to the individually measured coordinates.

In general, the wafer may develop a local elongation or contraction by a thermal process, and such elongation or contraction is considered as a cause of the non-linear errors of the shot areas. Such local elongation or contraction is estimated to occur, in the wafers of a lot, in approximately the same shot areas. The present embodiment can achieve exact alignment for the selected shot areas, which are estimated to involve large non-linear errors, on all the wafers in the same lot, since the selected shot areas of the second or any subsequent wafer, estimated to involve large non-linear errors according to the results of measurement on the first wafer, are processed by one of the above-mentioned two methods. Also the loss in the throughput is minimized because the measurements on all the shot areas are executed only on the first wafer.

In the above-explained embodiment, the exposure for each shot area for the second or any subsequent wafer is executed either according to the new coordinate of arrangement or with the addition of an offset value or according to the individually measured coordinate, solely depending on the results of measurement of all the shot areas of the first wafer, but it is also possible to measure all the shot areas either on the first and second wafers, or on the first to third wafers, or on four or more wafers and to determine the method of exposure on the shot areas of any subsequent wafer according to the averaged results of such measurement.

In this manner it becomes possible to average the non-linear error of each shot area for the plural wafers and to designate the selected shot areas with such averaged value, thereby improving the accuracy of designation of the selected shot areas through said averaging.

Also in the above-explained embodiment, the specified shot areas for obtaining the measured values required for the calculation of parameters are determined in advance, but, if the results of calculation with such parameters indicate that the specified shot area for obtaining the measured value involves large non-linear error (namely if said shot area is designated as the selected shot area), such specified shot area may be replaced in the wafer by a nearby shot area with a small non-linear error. Stated otherwise, the selected shot areas may be excluded in advance from the specified shot areas. Also instead of setting the specified shot areas in advance, they may be selected, after the measurement of all the shot areas, from those with small non-linear errors.

In the following there will be explained an example of the method for replacing a part of preselected specified shot areas. At first the measurement is conducted on all the shot areas of the first wafer of a lot. Then the minimum square method is executed to determine, in case of the first-order approximation, the values a1–f1 of the parameters a–f satisfying the equation (3) and the non-linear error is calculated for all the shot areas, utilizing the coordinates of arrangement measured as the result of alignment of all the shot areas. Then the values a2–f2 of the parameters a–f satisfying the equation (3) are determined again, solely utilizing the measured values of the shot areas in which the non-linear error is smaller than a predetermined value. Then any shot area, for which the non-linear error calculated from said parameter values a2–f2 is larger than said predetermined value is excluded from the preselected specified shot areas, and is replaced by a nearby shot area of which the non-linear error is smaller than the predetermined value.

When all the specified shot areas are finally determined in this manner, there are determined values a3–f3 of the parameters a–f satisfying the equation (3), based on the measured coordinates of arrangement of these specified shot areas, and the non-linear errors for all the shot areas are calculated and memorized. The subsequent exposures are conducted in the same manner as in the sequence shown in FIGS. 8 and 9. Furthermore, the alteration or determination of the specified shot areas, classification of the exposure method for the shot areas and/or the offset value to be added to the shot area involving a large non-linear error may be determined, not from the results of measurement on the first wafer only, but from the averaged result of measurements on all the shot areas on the first and second wafers, or the first to third wafers, or four or more wafers.

The above-explained method utilizes three sets of parameter values a1–f1, a2–f2 and a3–f3, but the following method is also usable. After the measurement of all the shot areas, the parameter values a–f satisfying the equation (1) are determined, utilizing the measured values of the preselected specified shot areas, and the non-linear error is calculated for all the shot areas. Based on these results, there are executed alteration in number and/or position and determination of the preselected specified shot areas, then the parameter values a3–f3 are determined and the non-linear errors are calculated. It is furthermore possible to effect the alternation in the arrangement (number/position) and the determination of the specified shot areas, based on the non-linear errors obtained from the parameter values a1–f1.

In the following there will be explained an example of the method for determining the specified shot areas after the measurement of all the shot areas.

At first all the shot areas are measured on the first wafer of the lot. Then values a4–f4 of the parameters a–f satisfying the equation (3) are determined by the minimum square method utilizing the coordinates of arrangement measured by the alignment of all the shot areas, and the non-linear errors are calculated for all the shot areas. Then values a5–f5 of the parameters a–f satisfying the equation (3) are determined again, solely utilizing the measured values of the shot areas in which the nonlinear error is smaller than a predetermined value, and the non-linear errors are calculated, based on said parameters a5–f5. Then shot areas of a certain number (at least 3 areas, for example 8 areas) are selected in the increasing order of the calculated non-linear errors, and thus selected shot areas are determined as the specified shot areas. The measured coordinates of these specified shot areas are utilized for determining again the values a6–f6 of the parameters a–f satisfying the equation (3), and the non-linear errors of all the shot areas are calculated and memorized, based on said values a6–f6. The subsequent exposures are conducted in the same flow as shown in FIGS. 8 and 9.

Furthermore, the determination of the specified shot areas, classification of the exposure method for the shot areas and/or the offset value to be added to the selected shot areas involving a large non-linear error may be determined, not from the results of measurement on the first wafer only, but from the averaged results of measurements on all the shot areas on the first and second wafers, or the first to third wafers, or four or more wafers. Furthermore, the above-explained method utilizes three sets of parameter values a4–f4, a5–f5 and a6–f6, but it is also possible to determine the specified shot areas based on the non-linear errors obtained for example from the values a4–f4.

Also in case the shot areas involving large non-linear errors occupy a considerable portion of the plural shot areas in the peripheral part of the wafer or are concentrated in the peripheral and central areas of the wafer, plural shot areas are selected as specified ones for example from the shot areas in the outermost wafer portion, for determining parameter values a7–f7, and also plural shot areas are selected as specified ones from the shot areas in the central portion, for determining parameter values a8–f8. Then the non-linear errors for all the shot areas are calculated, based on each set of parameter values, and, based on said non-linear errors, there is determined whether the exposure of each shot area is to be executed with the new coordinate of arrangement corresponding to the parameter values a7–f7 or a8–f8. In this manner, instead of applying the same first-order approximation to all the shot areas, it is also possible, depending on the state of the wafer, to determine the specified shot areas for example respectively in the central and peripheral areas of the wafer and to effect the first-order approximation in each area for determining the new coordinates of arrangement. More specifically, it is also possible to divide the shot areas of the wafer into plural blocks and to effect the first-order approximation in each block.

Figure 8:
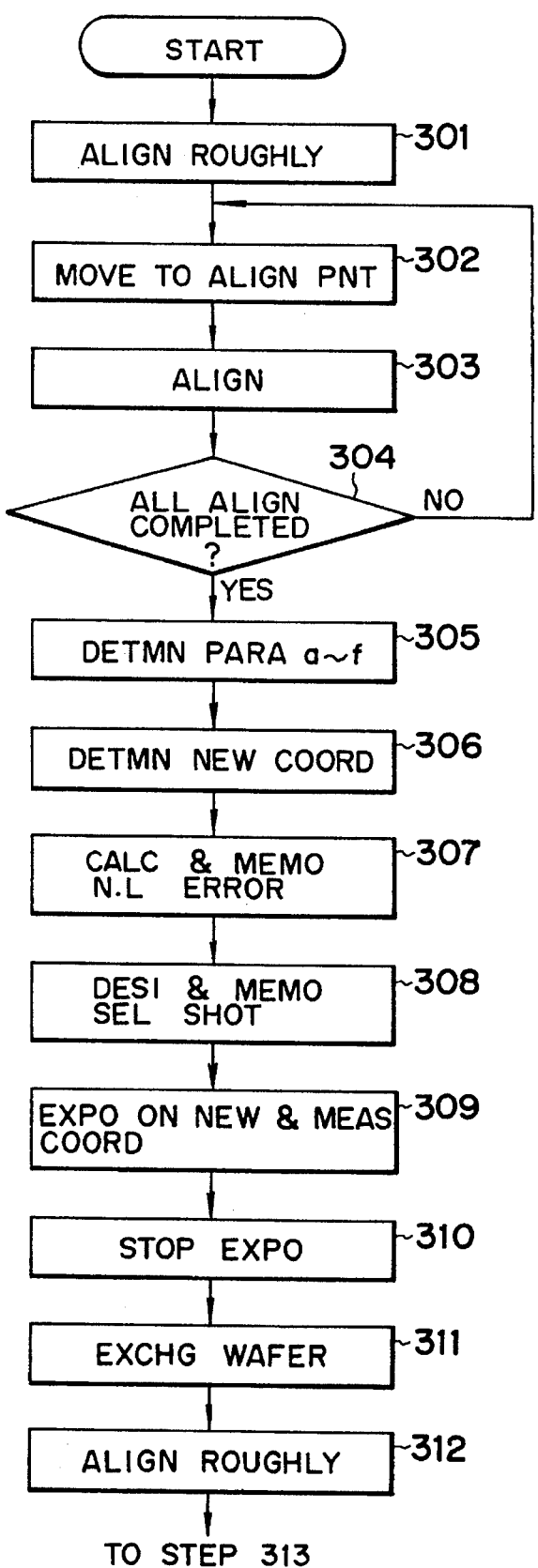
FIGS. 8 and 9 are flow charts showing example of alignment constituting a third embodiment of the present invention.

Furthermore the selection whether to divide the wafer into plural blocks and to apply different first-order approximations in said blocks, or to apply a common first-order (or higher-order) approximation to all the shot areas, or to adopt the method shown in FIGS. 8 and 9 may be made not according to the result of measurement of all the shot areas of the first wafer, but according to that including the second or subsequent wafers. Also in case of the first-order approximations applied to the plural blocks divided in the wafer, the exposure for the shot areas involving large non-linear errors may be made according to the individual measurements or with the addition of offset values.

Also in the determination of the parameters a–f from the result of measurement of the plural (at least three) specified shot areas, it is possible to suitably weight the measured values of the specified shot areas and to adopt thus weighted values for said determination. In such case, the weights of the specified shot areas may be determined according to the magnitude of fluctuation in each non-linear error among the different wafers.

Furthermore, the third embodiment may be applied to the second embodiment. More specifically, in the determination of the model function on the first wafer in the second embodiment, the anticipated coordinates of arrangement are determined from said model function, and the parameters a–f are determined from the equation (6), utilizing the measured coordinate of each of the plural specified shot areas on the first wafer. Then said parameters a–f and the anticipated coordinates of arrangement are utilized for calculating the actual coordinates of arrangement of all the shot areas on the first wafer, and there is discriminated whether the difference between the calculated coordinate and the anticipated coordinate exceeds a tolerance value. Subsequently, as in the third embodiment, the shot areas in which said tolerance is exceeded are designated as the selected shot areas, and, for the second and subsequent wafers, the alignment of the wafer stage ST for the shot areas other than the selected ones is made according to the actual coordinates of arrangement calculated according to the second embodiment, while that for the selected shot areas is made either of the coordinates already explained in the third embodiment.

In the foregoing embodiments there has been explained an aligning method (with first-order approximation) effective for a wafer involving linear distortion, but the present invention can also provide similar effects when applied to the aligning method effective for a wafer involving non-linear distortion. In the following such aligning method effective for non-linear distortion will be explained briefly.

Figure 10:
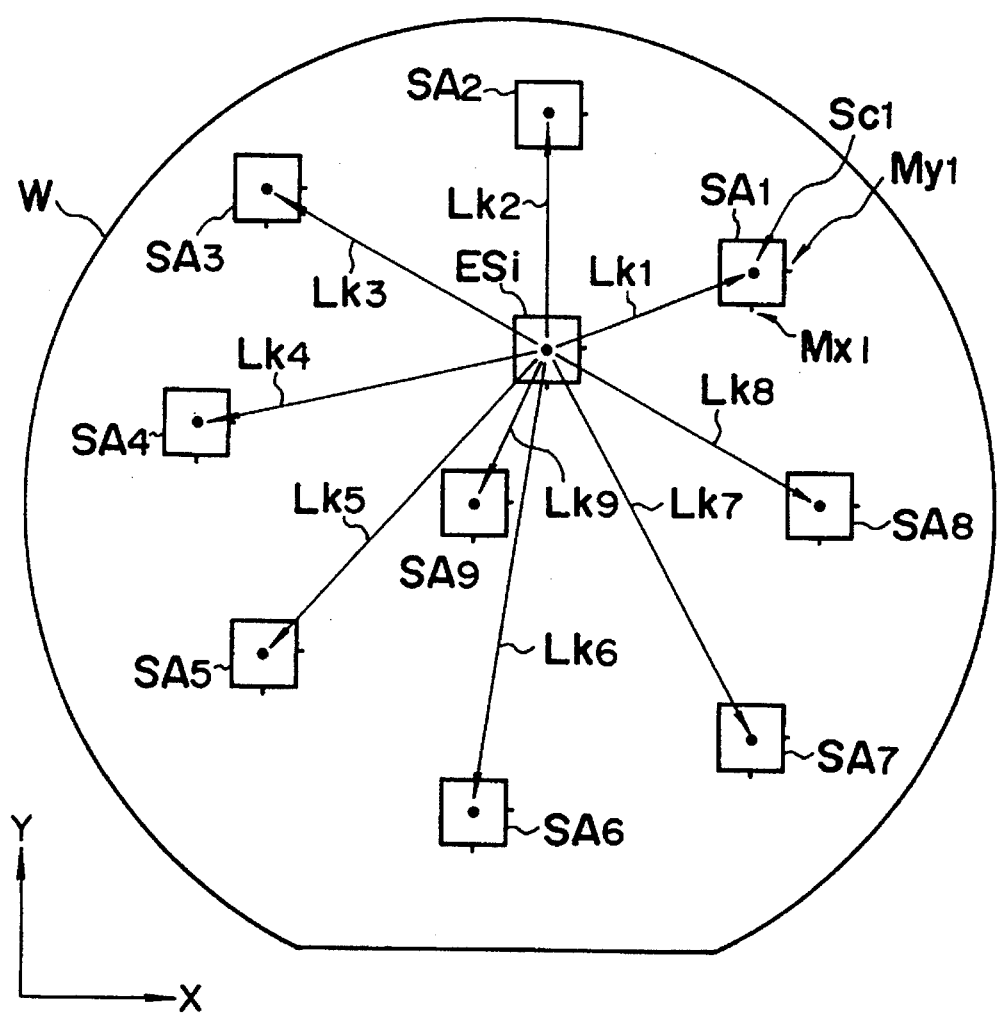
FIGS. 10 and 11 are views showing alignment methods effective for a wafer including a non-linear distortion.

A first aligning method is featured, in the determination of the coordinate position an i-th shot area ESi on wafer W as shown in FIG. 10, by giving weights $W_{in}$ to the coordinate positions of 9 sample shot areas, according to the distances $L_{K1}$–$L_{K9}$ between the shot area ESi and sample shot areas $SA_1$–$SA_9$, in a number m (m=9 in case of FIG. 10). Thus, in said first method, after the detection of the alignment marks $(M_{x1}, M_{y2})$ for each sample shot area the sum Ei of squares of the remaining difference is evaluated according to the equation (12), and the parameters a–f are so determined as to minimize the value thereof. In this procedure, the sample shot areas utilized for each shot area are same in the number and in the positions, but the distances to the sample shot areas naturally vary for each shot area, so that the weight $W_{in}$ given to each shot area becomes different. Consequently, the coordinate position of each shot area is calculated by the parameters a–f determined for each shot area.

$$Ei = \sum_{n=1}^{m} W_{in} \{(\Delta x_n - \Delta X_n)^2 + (\Delta y_n - \Delta Y_n)^2\} \quad (12)$$

In this first method, the weights $W_{in}$ for the coordinate positions of the sample shot areas are varied for each shot area on the wafer W. For this purpose, the weight $W_{in}$ is represented by the function of the distance $L_{kn}$ between the i-th shot area ESi and the n-th sample shot area SAn, as shown by the equation (13):

$$W_{in} = \frac{1}{\sqrt{2\pi S}} e^{-L_{kn}^2/2S} \quad (13)$$

wherein S is a parameter for varying the levels of the weights.

As will be apparent from the equation (13), the weight $W_{in}$ to the alignment data (coordinate position) becomes larger in a sample shot area of which distance $L_{kn}$ to the i-th shot area ESi is shorter.

Also if the parameter S is sufficiently large in the equation (13), the result of statistical processing becomes substantially equal to that obtained in the EGA method. On the other hand, if all the shot areas to be exposed on the wafer are selected as the sample shot areas and the parameter S is made sufficiently close to zero, there will be obtained a result substantially equal to that in the die-by-die (D/D) method. Stated differently, said first method can provide an interim result between the EGA method and the D/D method by suitable setting of the parameter S, and can vary the effect from the EGA method to the D/D method by suitable variation of said parameter S. It is therefore possible to flexibly vary the alignment for different layers, for example according to the feature of the non-linear components (for example magnitude or regularity thereof), the step pitch or the reproducibility of measurement with the alignment sensor, and to achieve optimum alignment for each layer.

In the following a second aligning method will be explained with reference to FIG. 11. For the purpose of simplicity, it is assumed that the wafer W contains non-linear distortion symmetrical to a point, which coincides with the center of the wafer.

Figure 11:
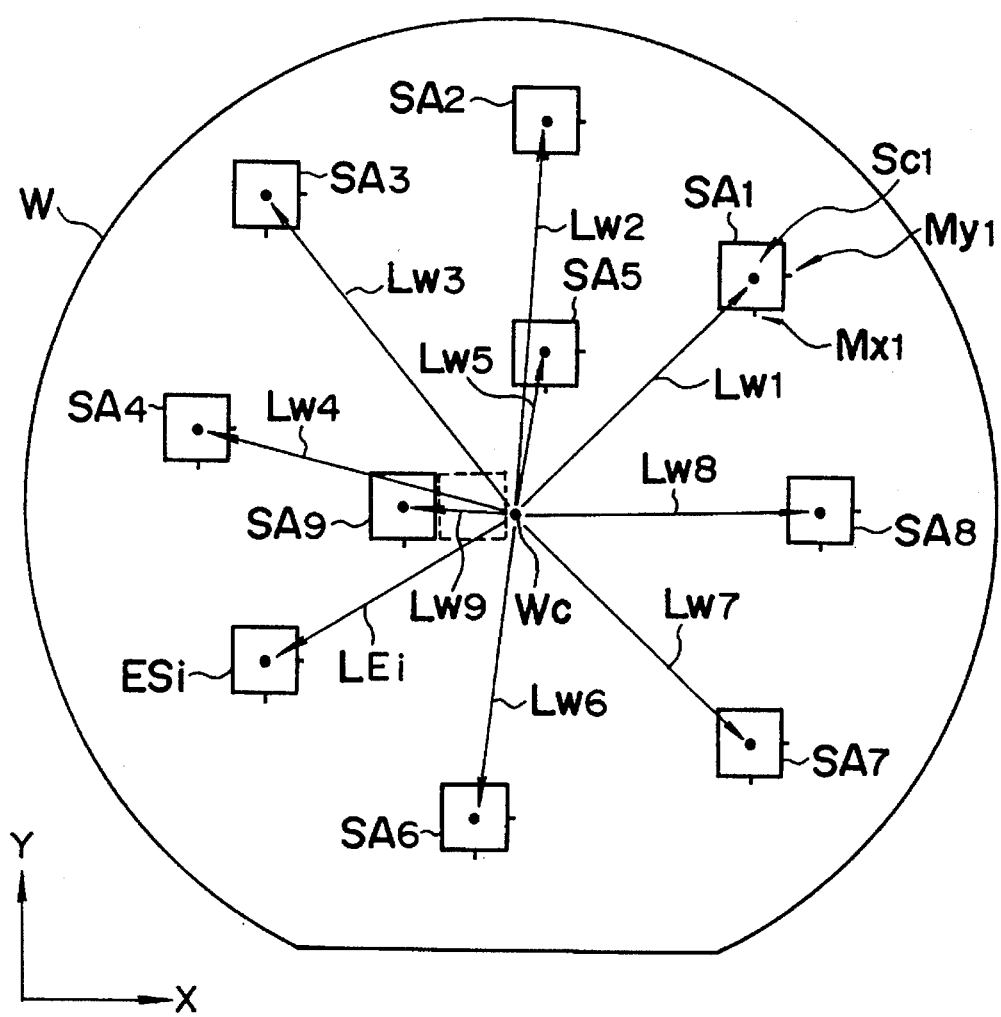

The second method is featured by giving weights $W_{in}'$ to the coordinate positions of the nine sample shot areas, according to the distance (radius) $L_{Ei}$ between the center of wafer deformation (center of symmetry of the non-linear deformation), or namely center Wc of the wafer, and the i-th shot area ESi, and also according to the distances (radii) $L_{w1}$–$L_{w9}$ between the wafer center Wc and the sample shot areas SA1–SA9 of a number m (m=9 in FIG. 11). In this second method, after the detection of alignment marks ($M_{x1}$, $M_{y1}$) for each sample shot area, the sum Ei' of squares of the remaining differences is evaluated by the equation (14), and the parameters a–f are so determined as to minimize the value thereof. Also in this second method, the weights $W_{in}'$ vary for each shot area, so that the parameters a–f are determined by the statistical calculation for each shot area.

$$Ei' = \sum_{n=1}^{m} W_{in}'\{(\Delta x_n - \Delta X_n)^2 + (\Delta y_n - \Delta Y_n)^2\} \quad (14)$$

In order to vary the weights $W_{in}'$ for the sample shot areas, for each shot area on the wafer W, the weights $W_{in}'$ are represented by a function of the distance (radius) $L_{Ei}$ between the i-th shot area ESi on the wafer W and the wafer center Wc, as shown in the equation (15), wherein S is a parameter for varying the level of the weighting:

$$W_{in}' = \frac{1}{\sqrt{2\pi S}} e^{-(L_{Ei}-L_{wn})^2/2S} \quad (15)$$

As will be apparent from the equation (15), the weight $W_{in}'$ to the alignment data becomes larger in a sample shot area of which distance (radius) $L_{wn}$ to the wafer center Wc is closer to the distance (radius) $L_{Ei}$ between the wafer center Wc and the i-th shot area ESi on the wafer W. Stated differently, largest weight $W_{in}'$ is given to the alignment data of a sample shot area positioned on a circle of a radius $L_{Ei}$ about the wafer center Wc, and said weight $W_{in}'$ becomes smaller as the sample shot area becomes radially apart from said circle. Also this second method can vary the effect thereof from that of the EGA method to that of the D/D method, as in the first method, by suitable variation of the parameter S.

The above-explained first or second method may be employed instead of the aligning method of the first-order approximation in the first to third embodiments. However, in case of the above-mentioned first or second method, the parameters a–f have to be determined for each of the shot areas present on the wafer.

Furthermore, the apparatus to which the present invention is applicable is not limited to that shown in the foregoing embodiments, and the present invention is applicable to various other apparatus. As an example, the various calculations executed by hardwares as shown in FIGS. 1 and 2 may also be executed by a software capable of attaining similar functions.

Furthermore, the alignment sensor for mark measurement is not limited to that of LSA method or of FIA method as shown in FIGS. 1 and 2, but can be of any known method, for example a method of optically detecting a one-dimensional diffraction grating mark formed on a wafer and determining the wafer position with a high resolving power from the pitch information obtained from said optical detection, as disclosed in the Japanese Patent Laid-Open Application No. 2-272305, or an image processing method. Also, in addition to the TTL method and the off-axis method, there may be employed the TTR (through-the-reticle) method.

What is claimed is:

1. A method of aligning each of a plurality of areas on a substrate, onto a predetermined position in a coordinate system defining a movement position of said substrate, comprising the steps of:

correcting each of preset coordinate positions of the areas, using a first model equation corresponding to an arrangement of the areas;

measuring the coordinate positions of each of at least three specified areas, in the coordinate system;

statistically processing the corrected coordinate positions and the measured coordinate positions of at least three specified areas, thereby to determine a parameter for a second model equation corresponding to the arrangement of the plurality of areas; and calculating each of coordinate positions of the plurality of areas in the coordinate system, based on the second model equation including the determined parameter and on each of corrected coordinate positions of the plurality of areas.

2. A method according to claim 1, wherein said first model equation is a polynomial function higher than the second model equation, a trigonometric function, or an exponential function.

3. A method according to claim 1, further comprising the steps of measuring coordinate positions of the areas on at least one substrate, in the coordinate system, and of establishing said first model equation from the measured coordinate positions.

4. A method according to claim 3, wherein a number of said specified areas is equal to or less than a number of areas of which coordinate positions are measured for establishing said first model equation.

5. A method according to claim 1, wherein said first model equation is established so that a deviation between the measured coordinate position and the calculated coordinate position of each of the at least three specified areas is minimum.

6. A method of aligning each of a plurality of areas on a substrate, onto a predetermined position in a coordinate system defining a movement position of said substrate, comprising the steps of:

correcting each of preset coordinate positions of the areas, using a model equation corresponding to an arrangement of the areas;

measuring the coordinate position of each of at least three specified areas, in the coordinate system; and statistically processing the corrected coordinate positions and the measured coordinate positions of the at least three specified areas, thereby to determine a coordinate position of each of the plurality of areas in the coordinate system.

7. A method according to claim 6, wherein said model equation is a polynomial function having an order higher than second order, a trigonometric function, or an exponential function.

8. A method according to claim 6, further comprising the step of determining a weight at each of the at least three specified areas, in accordance with a distance between one area on the substrate and each of the specified areas, prior to a determination of a coordinate position of the one area on the coordinate system, wherein the determined weight is used in said statistical processing.

9. A method according to claim 6, further comprising the step of moving said substrate in accordance with the determined coordinate positions so that each of the plurality of areas is exposed by a pattern image of a mask.

10. A method of aligning each of a plurality of areas on a substrate, for every N substrates (N being an integer satisfying $N \geq 2$), onto a predetermined position in a coordinate system defining a movement position of said substrate, comprising the steps of:

establishing a first model equation corresponding to an arrangement of the areas on at least one specified substrate of which an ordinal number is within (k−1)-th, based on a coordinate position of each of a plurality of designated areas on the specified substrate in the coordinate system, prior to an alignment of each of a plurality of areas on a k-th substrate (k being an integer satisfying $2 \leq k \leq N$), onto a predetermined position;

correcting each of preset coordinate positions of the areas on the k-th substrate, using the first model equation;

measuring the coordinate positions of each of at least three specified areas on the k-th substrate, in the coordinate system;

statistically processing the corrected coordinate positions and the measured coordinate positions of the at least three specified areas, thereby to determine a parameter for a second model equation corresponding to the arrangement of the plurality of areas; and calculating each of coordinate positions of the plurality of areas in the coordinate system, based on the second model equation including the determined parameter and on each of corrected coordinate positions of the plurality of areas.

11. A method according to claim 10, wherein said first model equation is a polynomial function of which an order is higher than that of the second model equation, a trigonometric function, or an exponential function.

12. A method according to claim 10, further comprising the step of determining a weight at each of the at least three specified areas, in accordance with a distance between one area on the k-th substrate and each of the specified areas, prior to a calculation of a coordinate position of the one area, in the coordinate system, wherein the determined weight is used in said statistical processing.

13. A method according to claim 10, further comprising the step of determining a weight at each of the at least three specified areas, in accordance with a distance between one area on the k-th substrate and a predetermined point and a distance between the predetermined point and each of the specified areas, in the coordinate system, wherein the determined weight is used in said statistical processing.

14. A method according to claim 10, wherein said predetermined point is a center of a deformation of the substrate.

15. A method according to claim 10, wherein said specified substrate is a first substrate or a (k−1)-th substrate.

16. A method according to claim 10, wherein said designated areas are all of the areas on said specified substrate.

17. A method of aligning each of a plurality of areas on a substrate, for every N substrates (N being an integer satisfying $N \geq 2$), onto a predetermined position in a coordinate system defining a movement position of said substrate, comprising the steps of:

establishing a model equation corresponding to an arrangement of the areas on at least one specified substrate of which an ordinal number is within (k−1)-th, based on a coordinate position of each of a plurality of designated areas on the specified substrate in the coordinate system, prior to an alignment of each of a plurality of areas on a k-th substrate (k being an integer satisfying $2 \leq k \leq N$), onto a predetermined position;

correcting each of preset coordinate positions of the areas on the k-th substrate, using the model equation;

measuring the coordinate position of each of at least three specified areas on the k-th substrate, in the coordinate system; and statistically processing the corrected coordinate positions and the measured coordinate positions of the at least three specified areas, thereby to determine a coordinate position of each of the plurality of areas on the k-th substrate, in the coordinate system.

18. A method according to claim 17, further comprising the step of moving said k-th substrate in accordance with the determined coordinate positions so that each of the plurality of areas on the k-th substrate is exposed by a pattern image of a mask.

19. A method of aligning each of a plurality of areas on a substrate, for every N substrates (N being an integer satisfying $N \geq 2$), onto a predetermined position in a coordinate system defining a movement position of said substrate, comprising the steps of:

prior to an alignment of each of a plurality of areas on a k-th substrate (k being an integer satisfying $2 \leq k \leq N$), onto a predetermined position, measuring a coordinate position of each of the areas on a specified substrate of which an ordinal number is within (k−1)-th, in the coordinate system; statistically processing the measured coordinate positions of the areas, thereby to calculate a coordinate position of each of the areas on the specified substrate, in the coordinate system; and selecting one or more areas at which a deviation between the calculated coordinate position and the measured coordinate position exceeds a predetermined value;

measuring the coordinate position of each of at least three specified areas on the k-th substrate, in the coordinate system, said at least three areas being other than the selected one or more areas; and statistically processing the measured coordinate positions of the at least three specified areas, thereby to determine a coordinate position of each of the plurality of areas other than the selected one or more areas, on the k-th substrate, in the coordinate system.

20. A method according to claim 19, wherein each of said plurality of areas other than the selected one or more areas on the k-th substrate, is aligned to the predetermined position in accordance with the calculated coordinate position, and the selected one or more areas are aligned to the predetermined position in accordance with coordinate positions different from the coordinate positions calculated by the statistical processing on the k-th substrate.

21. A method according to claim 20, wherein the coordinate positions of the selected one or more areas on the k-th substrate are determined by a deviation between the measured coordinate positions and the calculated coordinate positions on the substrate, and by coordinate positions calculated by the statistical processing on the k-th substrate.

22. A method according to claim 20, wherein the selected one or more areas on the k-th substrate are aligned to the predetermined position in accordance with separately measured coordinate positions.

23. A method according to claim 19, further comprising the step of moving said k-th substrate in accordance with the calculated coordinate positions so that each of the plurality of areas other than the selected one or more areas on the substrate is exposed by a pattern image of a mask.

24. A method of aligning each of a plurality of areas on a substrate, for every N substrates (N being an integer satisfying $N \geq 2$), onto a predetermined position in a coordinate system defining a movement position of said substrate, comprising the steps of:

measuring a coordinate position of each of areas on a specified substrate of which an ordinal number is within (k−1)-th, in the coordinate system, prior to an alignment of each of a plurality of areas on a k-th substrate (k being an integer satisfying $2 \leq k \leq N$), onto a predetermined position;

statistically processing the measured coordinate positions of the areas, thereby to calculate a coordinate position of each of the areas on the specified substrate, in the coordinate system; and selecting one or more areas at which a deviation between the calculated coordinate position and the measured coordinate position exceeds a predetermined value;

wherein the selected one or more areas are eliminated from specified areas of which coordinate positions are measured, on the k-th substrate.

25. A method of aligning each of a plurality of areas on a substrate, onto a predetermined position in a coordinate system defining a movement position of said substrate, comprising the steps of:

measuring a coordinate position of each of specified areas on the substrate, in the coordinate system;

statistically processing the measured coordinate positions, thereby to calculate a coordinate position of each of the specified areas, in the coordinate system; and statistically processing the measured positions of the specified areas other than one or more areas at which a deviation between the calculated coordinate position and the measured coordinate position exceeds a predetermined value, thereby to calculate a coordinate position of each of the plurality of areas, in the coordinate system.

26. A method of exposing each of a plurality of areas on a substrate with a pattern image, comprising the steps of:

measuring positions of at least three areas on the substrate, in a coordinate system defining a movement of the substrate;

statistically processing the measured positions to calculate positions of the at least three areas in the coordinate system; and moving the substrate based on the measured positions of areas at which a deviation between the calculated coordinate position and the measured coordinate position is equal to or less than a predetermined value.

* * * * *